(12) United States Patent
Hanada

(10) Patent No.: US 11,928,848 B2
(45) Date of Patent: Mar. 12, 2024

(54) LIGHT RECEIVING DEVICE, SOLID-STATE IMAGING APPARATUS, ELECTRONIC EQUIPMENT, AND INFORMATION PROCESSING SYSTEM

(71) Applicant: SONY SEMICONDUCTOR SOLUTIONS CORPORATION, Kanagawa (JP)

(72) Inventor: Seigo Hanada, Tokyo (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 157 days.

(21) Appl. No.: 17/609,930

(22) PCT Filed: May 8, 2020

(86) PCT No.: PCT/JP2020/018746
§ 371 (c)(1),
(2) Date: Nov. 9, 2021

(87) PCT Pub. No.: WO2020/235363
PCT Pub. Date: Nov. 26, 2020

(65) Prior Publication Data
US 2022/0222912 A1  Jul. 14, 2022

(30) Foreign Application Priority Data
May 22, 2019  (JP) ................. 2019-096331

(51) Int. Cl.
*G06V 10/147* (2022.01)
*G02B 5/18* (2006.01)
(Continued)

(52) U.S. Cl.
CPC ......... *G06V 10/147* (2022.01); *G02B 5/1814* (2013.01); *G02B 5/1866* (2013.01);
(Continued)

(58) Field of Classification Search
CPC .. G02B 3/0056; G02B 5/1814; G02B 5/1819; G02B 5/1866; G02B 5/201;
(Continued)

(56) References Cited

U.S. PATENT DOCUMENTS

2015/0042858 A1*  2/2015  Kokubun .......... H01L 27/14629
                                                          348/302
2016/0012790 A1   1/2016  Zheng et al.
(Continued)

FOREIGN PATENT DOCUMENTS

JP  2015-037102 A  2/2015
JP  2015-115527 A  6/2015
(Continued)

OTHER PUBLICATIONS

International Search Report and Written Opinion of PCT Application No. PCT/JP2020/018746 dated Jul. 14, 2020, 09 pages of ISRWO.
(Continued)

*Primary Examiner* — Amy R Hsu
(74) *Attorney, Agent, or Firm* — CHIP LAW GROUP

(57) ABSTRACT

Higher-speed image recognition processing can be implemented. A light receiving device according to an embodiment includes: a plurality of first filters (130) each transmitting an edge component in a predetermined direction in an incident image; a plurality of second filters (150) each transmitting light of a predetermined wavelength band in incident light; and a plurality of photoelectric conversion elements (PD) each photoelectrically converting light transmitted through one of the plurality of convolution filters and one of the plurality of color filters.

18 Claims, 19 Drawing Sheets

(51) Int. Cl.
　　*G02B 5/20* (2006.01)
　　*G06V 10/143* (2022.01)
　　*G06V 10/82* (2022.01)
　　*H01L 27/146* (2006.01)
　　*H04N 25/70* (2023.01)

(52) U.S. Cl.
　　CPC .......... *G02B 5/201* (2013.01); *G06V 10/143* (2022.01); *G06V 10/82* (2022.01); *H01L 27/14621* (2013.01); *H01L 27/14627* (2013.01); *H01L 27/14645* (2013.01); *H04N 25/70* (2023.01)

(58) Field of Classification Search
　　CPC .... G06V 10/143; G06V 10/147; G06V 10/82; H01L 27/14621; H01L 27/14627; H01L 27/14645; H04N 23/00; H04N 25/13; H04N 25/70
　　See application file for complete search history.

(56) References Cited

U.S. PATENT DOCUMENTS

| | | | |
|---|---|---|---|
| 2016/0295133 A1* | 10/2016 | Rudmann | H04N 23/10 |
| 2017/0148177 A1 | 5/2017 | Takahashi | |
| 2018/0130186 A1* | 5/2018 | Romanenko | G06F 18/2451 |
| 2019/0138830 A1* | 5/2019 | Justice | G06V 20/52 |
| 2019/0164642 A1* | 5/2019 | Hartung | G06N 3/045 |

FOREIGN PATENT DOCUMENTS

| | | |
|---|---|---|
| JP | 2019-016114 A | 1/2019 |
| JP | 2019-029681 A | 2/2019 |
| WO | 2015/186284 A1 | 12/2015 |

OTHER PUBLICATIONS

G. Chen, et al., "ASP Vision: Optically Computing the First Layer of Convolutional Neural Networks Using Angle Sensitive Pixels", Nov. 16, 2016, 10 pages.

\* cited by examiner

LIGHT RECEIVING DEVICE, SOLID-STATE IMAGING APPARATUS, ELECTRONIC EQUIPMENT, AND INFORMATION PROCESSING SYSTEM

CROSS REFERENCE TO RELATED APPLICATIONS

This application is a U.S. National Phase of International Patent Application No. PCT/JP2020/018746 filed on May 8, 2020, which claims priority benefit of Japanese Patent Application No. JP 2019-096331 filed in the Japan Patent Office on May 22, 2019. Each of the above-referenced applications is hereby incorporated herein by reference in its entirety.

FIELD

The present disclosure relates to a light receiving device, a solid-state imaging apparatus, electronic equipment, and an information processing system.

BACKGROUND

In recent years, a technology for recognizing an object included in an image by performing image processing by a convolution operation on image data acquired by an imaging apparatus has been developed.

CITATION LIST

Non Patent Literature

Non Patent Literature 1: Huaijin G. Chen, Suren Jayasuriya, Jiyue Yang, Judy Stephen, Sriram Sivaramakrishnan, Ashok Veeraraghavan, Alyosha C. Molnar; ASP Vision: Optically Computing the First Layer of Convolutional Neural Networks Using Angle Sensitive Pixels (CVPR) 2016, pp. 903-912.

SUMMARY

Technical Problem

However, since image recognition processing by the convolution operation has a large amount of data to be processed and the processing itself is complicated, there is a problem that it is difficult to achieve higher real-time performance.

Therefore, the present disclosure proposes the light receiving device, the solid-state imaging apparatus, the electronic equipment, and the information processing system that enable implementation of higher-speed image recognition processing.

Solution to Problem

To solve the above-described problem, a light receiving device according to one aspect of the present disclosure comprises: a plurality of first filters that each transmit an edge component in a predetermined direction in an incident image; a plurality of second filters that each transmit light of a predetermined wavelength band in incident light; and a plurality of photoelectric conversion elements that each photoelectrically convert light transmitted through one of the plurality of first filters and one of the plurality of second filters.

DESCRIPTION OF EMBODIMENTS

Figure 1:
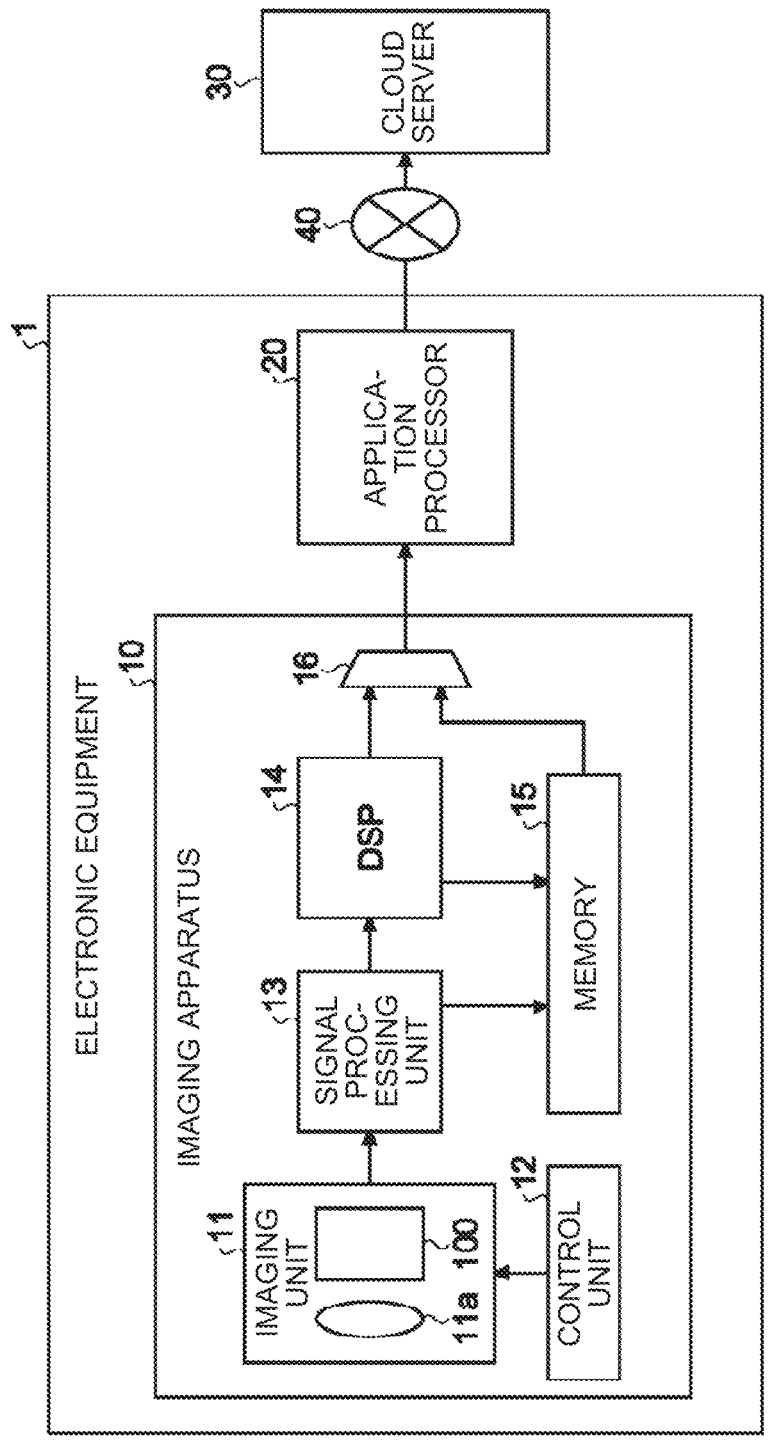
FIG. 1 is a block diagram illustrating a schematic configuration example of an information processing system including electronic equipment according to an embodiment.

Hereinafter, an embodiment of the present disclosure will be described in detail with reference to the drawings. Note that, in the following embodiment, the same parts are denoted by the same reference numerals, and redundant description will be omitted.

In addition, the present disclosure will be described according to the following item order.

1. Embodiment
 1.1 Schematic configuration example of electronic equipment
 1.2 Schematic configuration example of solid-state imaging apparatus
  1.3 Circuit configuration example of unit pixel
  1.4 Basic function example of unit pixel
  1.5 Stacked configuration example of image sensor
  1.5.1 Modification
  1.6 Application example of optical convolution operation
  1.7 Overview of CNN
  1.8 Application to the present embodiment
  1.9 Convolution filter
  1.10 Functional example of convolution filter array
  1.11 Relationship between pattern and frequency spectrum of convolution filter array
  1.12 Configuration example of combination filter
  1.12.1 Modification of combination filter
  1.13 Overview of convolution operation (without color filter)
  1.14 Overview of convolution operation (with color filter)
  1.14.1 Modification of convolution operation
  1.15 Operation and effect
2. Application to mobile body 1. Embodiment 1.1 Schematic Configuration Example of Electronic Equipment FIG. 1 is a block diagram illustrating a schematic configuration example of an information processing system including electronic equipment according to the embodiment. As illustrated in FIG. 1, electronic equipment 1 includes an imaging apparatus 10 and an application processor 20. The imaging apparatus 10 includes an imaging unit 11, a control unit 12, a signal processing unit 13, a digital signal processor (DSP) 14, a memory 15, and an output unit 16.

The control unit 12 controls each unit in the imaging apparatus 10 according to, for example, an operation of a user or a set operation mode.

The imaging unit 11 includes, for example, an optical system 11a including a zoom lens, a focus lens, a diaphragm, and the like, and a solid-state imaging apparatus 100 having a configuration in which unit pixels including light receiving elements such as a photodiode are arranged in a two-dimensional matrix. Light incident from the outside is imaged on a light receiving surface on which the light receiving elements are arranged in the solid-state imaging apparatus 100 through the optical system 11a. Each unit pixel of the solid-state imaging apparatus 100 electrically converts the light incident on the light receiving element, thereby readably storing a charge corresponding to an amount of incident light. Then, the solid-state imaging apparatus 100 outputs a pixel signal based on the charge accumulated in each unit pixel as data in units of frames. Note that details of the solid-state imaging apparatus 100 will be described later.

Furthermore, in the present embodiment, the data read in units of frames from the solid-state imaging apparatus 100 is a result of a convolution operation (an optical convolution operation described later) performed using a physical convolution filter described later. Therefore, the data read from the solid-state imaging apparatus 100 is, for example, binary data such as a feature map.

The signal processing unit 13 performs various types of signal processing on the binary data read from the solid-state imaging apparatus 100. For example, the signal processing unit 13 compresses an amount of transmission by compressing the binary data by run-length compression or the like. In addition, in a case where the binary data includes color information, the signal processing unit 13 may convert the binary data into a YUV format, an RGB format, or the like. Furthermore, the signal processing unit 13 may perform, for example, processing such as noise removal and white balance adjustment on the binary data as necessary.

Note that in the present embodiment, the signal processing unit 13 is not an essential component and may be omitted. In this case, the binary data output from the solid-state imaging apparatus 100 may be directly input to the DSP 14 or the memory 15, or may be output to an external application processor 20 or the like via the output unit 16 without passing through the DSP 14. Furthermore, the binary data output from the imaging unit 11 can be data compressed by run-length compression or the like.

The DSP 14 may perform, for example, various types of signal processing on input binary data. The DSP 14 may perform, for example, image recognition processing using a deep neural network (DNN) on the input binary data. In this case, the DSP 14 functions as a machine learning unit using the DNN by reading and performing a learned model stored in the memory 15. Then, the DSP 14 functioning as the machine learning unit performs the image recognition processing using the DNN by multiplying a dictionary coefficient stored in the memory 15 and the binary data.

Furthermore, the DSP 14 outputs a result (hereinafter, referred to as a signal processing result) obtained by the signal processing on the binary data to the memory 15 and/or the output unit 16. Note that a memory controller that controls access to the memory 15 may be incorporated in the DSP 14.

Note that in the present embodiment, the DSP 14 is not an essential component and may be omitted. Alternatively, the DSP 14 may output the input binary data as it is without performing any signal processing on the input binary data. In these cases, the binary data output from the solid-state imaging apparatus 100 or the signal processing unit 13 may be input to the memory 15 or may be output to the external application processor 20 or the like via the output unit 16.

The memory 15 stores the signal processing result obtained by the DSP 14 as necessary. In addition, the memory 15 may store an algorithm of the learned model performed by the DSP 14 as a program and the dictionary coefficient. The program and the dictionary coefficient of the learned model, for example, created by an external cloud server 30 or the like may be downloaded to the electronic equipment 1 via a network 40 and stored in the memory 15, or may be stored in the memory 15 before shipping of the electronic equipment 1.

The output unit 16 selectively outputs the binary data output from the solid-state imaging apparatus 100, the signal processing unit 13, or the DSP 14, the signal processing result output from the DSP 14, or the binary data or the signal processing result stored in the memory 15, for example, in accordance with a selection control signal from the control unit 12.

The binary data or the signal processing result output from the output unit 16 as described above is input to the application processor 20 that processes display, a user interface, and the like. The application processor 20 is configured using, for example, a central processing unit (CPU) and the like, and executes an operating system, various application software, and the like. The application processor 20 may be equipped with functions such as a graphics processing unit (GPU) and a baseband processor. The application processor 20 performs various types of processing as necessary on the input binary data or the signal processing result, performs display to the user, or transmits the input binary data or the signal processing result to the external cloud server 30 via a predetermined network 40.

Note that as the predetermined network 40, for example, various networks such as the Internet, a wired local area network (LAN), a wireless LAN, a mobile communication network, and Bluetooth (registered trademark) can be used. Furthermore, a transmission destination of the binary data or the signal processing result is not limited to the cloud server 30, and may be various information processing apparatuses (systems) having a communication function, such as a server that operates alone or in cooperation with another server, a file server that stores various data, and a communication terminal such as a mobile phone.

1.2 Schematic Configuration Example of Solid-State Imaging Apparatus

Figure 2:
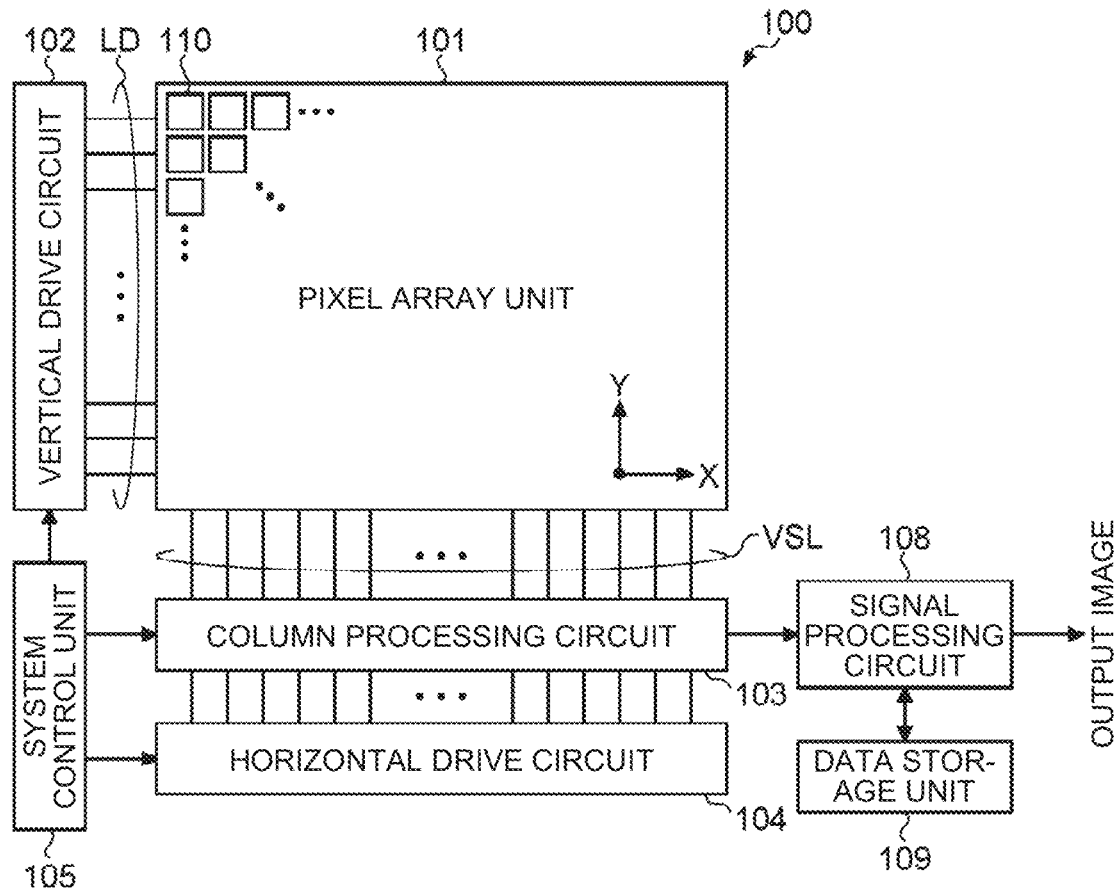
FIG. 2 is a block diagram illustrating a schematic configuration example of a solid-state imaging apparatus according to the embodiment.

FIG. 2 is a block diagram illustrating a schematic configuration example of a complementary metal-oxide-semiconductor (CMOS) solid-state imaging apparatus (hereinafter, simply referred to as an image sensor) according to the embodiment. Here, the CMOS image sensor is an image sensor created by applying or partially using a CMOS process. The solid-state imaging apparatus 100 according to the present embodiment may be a so-called back-illuminated type in which an incident surface is on a surface (hereinafter, referred to as a back surface) side opposite to an element formation surface in a semiconductor substrate, or may be a so-called front-illuminated type in which the incident surface is on a front surface side.

As illustrated in FIG. 2, the image sensor 100 includes, for example, a pixel array unit 101, a vertical drive circuit 102, a column processing circuit 103, a horizontal drive circuit 104, a system control unit 105, a signal processing circuit 108, and a data storage unit 109. In the following description, the vertical drive circuit 102, the column processing circuit 103, the horizontal drive circuit 104, the system control unit 105, the signal processing circuit 108, and the data storage unit 109 are also referred to as peripheral circuits.

The pixel array unit 101 has a configuration in which unit pixels (hereinafter, they may be simply described as "pixels") 110 each having a photoelectric conversion element that generates and accumulates a charge according to an amount of received light are arranged in a row direction and a column direction, that is, in a two-dimensional lattice pattern (hereinafter, referred to as a matrix pattern) in a matrix. Here, the row direction refers to an arrangement direction (a horizontal direction in the drawing) of the pixels in a pixel row, and the column direction refers to an arrangement direction (a vertical direction in the drawing) of the pixels in a pixel column. Specific circuit configurations and pixel structures of the unit pixels will be described later in detail.

In the pixel array unit 101, a pixel drive line LD is wired in the row direction for each pixel row, and a vertical signal line VSL is wired in the column direction for each pixel column with respect to a matrix-like pixel array. The pixel drive line LD transmits a drive signal for driving when the signal is read from the pixel. In FIG. 2, the pixel drive lines LD are illustrated as wiring lines one by one, but are not limited to the wiring lines one by one. One end of the pixel drive line LD is connected to an output terminal corresponding to each row of the vertical drive circuit 102.

The vertical drive circuit 102 includes a shift register, an address decoder, and the like, and drives all the pixels of the pixel array unit 101 at the same time or in units of rows. That is, the vertical drive circuit 102 constitutes a drive unit that controls operation of each pixel of the pixel array unit 101 together with the system control unit 105 that controls the vertical drive circuit 102. Although a specific configuration of the vertical drive circuit 102 is not illustrated, the vertical drive circuit generally includes two scanning systems of a read scanning system and a sweep scanning system.

The read scanning system sequentially selectively scans the unit pixels of the pixel array unit 101 row by row in order to read the signal from the unit pixel. The signal read from the unit pixel is an analog signal. The sweep scanning system performs sweep scanning on a read row on which read scanning is performed by the read scanning system, ahead of the read scanning by an exposure time.

By the sweep scanning by the sweep scanning system, unnecessary charges are swept out from the photoelectric conversion element of the unit pixel of the read row, so that the photoelectric conversion element is reset. Then, by sweeping out (resetting) unnecessary charges by the sweep scanning system, a so-called electronic shutter operation is performed. Here, the electronic shutter operation refers to an operation of discarding the charges of the photoelectric conversion element and newly starting exposure (starting accumulation of the charges).

The signal read by a read operation by the read scanning system corresponds to an amount of light received after an immediately preceding read operation or the electronic shutter operation. Then, a period from a read timing by the immediately preceding read operation or a sweep timing by the electronic shutter operation to the read timing by the current read operation is a charge accumulation period (also referred to as an exposure period) in the unit pixel.

A signal output from each unit pixel of the pixel row selectively scanned by the vertical drive circuit 102 is input to the column processing circuit 103 through each vertical signal line VSL for each pixel column. The column processing circuit 103 performs predetermined signal processing on the signal output from each pixel of the selected row through the vertical signal line VSL for each pixel column of the pixel array unit 101, and temporarily holds the pixel signal after the signal processing.

Specifically, the column processing circuit 103 performs at least noise removal processing, for example, correlated double sampling (CDS) processing or double data sampling (DDS) processing, as the signal processing. For example, fixed pattern noise unique to the pixel such as reset noise and threshold variation of an amplification transistor in the pixel is removed by the CDS processing. The column processing circuit 103 also includes, for example, an analog-digital (AD) conversion function, converts an analog pixel signal read and obtained from the photoelectric conversion element into a digital signal, and outputs the digital signal.

The horizontal drive circuit 104 includes the shift register, the address decoder, and the like, and sequentially selects a read circuit (hereinafter, referred to as a pixel circuit) corresponding to the pixel column of the column processing circuit 103. By selective scanning by the horizontal drive circuit 104, the pixel signals subjected to the signal processing for each pixel circuit in the column processing circuit 103 are sequentially output.

The system control unit 105 includes a timing generator that generates various timing signals and the like, and performs drive control of the vertical drive circuit 102, the column processing circuit 103, the horizontal drive circuit 104, and the like on the basis of various timings generated by the timing generator.

The signal processing circuit 108 has at least an arithmetic processing function, and performs various signal processing such as arithmetic processing on the pixel signal output from the column processing circuit 103. The data storage unit 109 temporarily stores data necessary for the signal processing in the signal processing circuit 108. Note that the signal processing circuit 108 may have the same configuration as or a different configuration from the signal processing unit 13 described above. Furthermore, the signal processing circuit 108 may be omitted.

Note that the binary data output from the signal processing circuit 108 (or the column processing circuit 103) is input to the signal processing unit 13, the DSP 14, the memory 15, or the output unit 16 as described above.

1.3 Circuit Configuration Example of Unit Pixel

Figure 3:
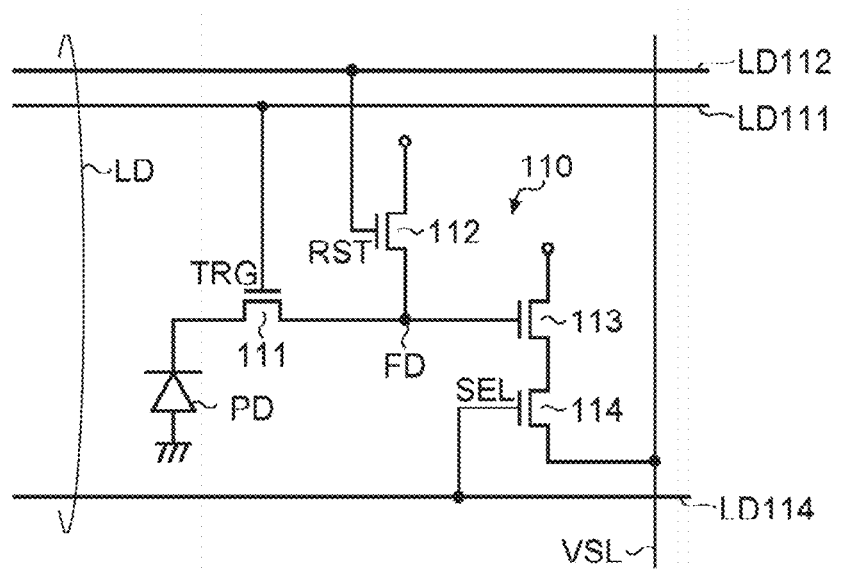
FIG. 3 is a circuit diagram illustrating a circuit configuration example of a unit pixel according to the embodiment.

FIG. 3 is a circuit diagram illustrating a circuit configuration example of the unit pixel according to the embodiment. As illustrated in FIG. 3, the unit pixel 110 includes a photodiode PD, a transfer transistor 111, a reset transistor 112, an amplification transistor 113, a selection transistor 114, and a floating diffusion layer FD.

A selection transistor drive line LD114 included in the pixel drive line LD is connected to a gate of the selection transistor 114, a reset transistor drive line LD112 included in the pixel drive line LD is connected to a gate of the reset transistor 112, and a transfer transistor drive line LD111 included in the pixel drive line LD is connected to a gate of the transfer transistor 111. Furthermore, the vertical signal line VSL having one end connected to the column processing circuit 103 is connected to a drain of the amplification transistor 113 via the selection transistor 114.

In the following description, the reset transistor 112, the amplification transistor 113, and the selection transistor 114 are also collectively referred to as the pixel circuit. The pixel circuit may include the floating diffusion layer FD and/or the transfer transistor 111.

The photodiode PD photoelectrically converts incident light. The transfer transistor 111 transfers the charge generated in the photodiode PD. The floating diffusion layer FD accumulates the charge transferred by the transfer transistor 111. The amplification transistor 113 causes the pixel signal having a voltage value corresponding to the charge accumulated in the floating diffusion layer FD to appear in the vertical signal line VSL. The reset transistor 112 releases the charge accumulated in the floating diffusion layer FD. The selection transistor 114 selects the unit pixel 110 to be read.

An anode of the photodiode PD is grounded, and a cathode is connected to a source of the transfer transistor 111. A drain of the transfer transistor 111 is connected to a source of the reset transistor 112 and a gate of the amplification transistor 113, and a node which is a connection point of these transistors constitutes the floating diffusion layer FD. Note that a drain of the reset transistor 112 is connected to a vertical reset input line (not illustrated).

A source of the amplification transistor 113 is connected to a vertical current supply line (not illustrated). The drain of the amplification transistor 113 is connected to the source of the selection transistor 114, and a drain of the selection transistor 114 is connected to the vertical signal line VSL.

The floating diffusion layer FD converts the accumulated charge into a voltage of the voltage value corresponding to an amount of charge thereof. Note that the floating diffusion layer FD may be, for example, a capacitance to ground. However, it is not limited thereto, and the floating diffusion layer FD may be a capacitance added by intentionally connecting a capacitor or the like to a node where the drain of the transfer transistor 111, the source of the reset transistor 112, and the gate of the amplification transistor 113 are connected.

1.4 Basic Function Example of Unit Pixel

Next, a basic function of the unit pixel 110 will be described with reference to FIG. 3. The reset transistor 112 controls discharge (reset) of the charge accumulated in the floating diffusion layer FD in accordance with a reset signal RST supplied from the vertical drive circuit 102 via the reset transistor drive line LD112. Note that by turning on the transfer transistor 111 when the reset transistor 112 is in an on-state, it is also possible to discharge (reset) the charge accumulated in the photodiode PD in addition to the charge accumulated in the floating diffusion layer FD.

When a high level reset signal RST is input to the gate of the reset transistor 112, the floating diffusion layer FD is clamped to a voltage applied through the vertical reset input line. Thus, the charge accumulated in the floating diffusion layer FD is discharged (reset).

Furthermore, when a low level reset signal RST is input to the gate of the reset transistor 112, the floating diffusion layer FD is electrically disconnected from the vertical reset input line and enters a floating state.

The photodiode PD photoelectrically converts the incident light and generates a charge corresponding to the amount of light. The generated charge is accumulated on the cathode side of the photodiode PD. The transfer transistor 111 controls transfer of the charge from the photodiode PD to the floating diffusion layer FD in accordance with a transfer control signal TRG supplied from the vertical drive circuit 102 via the transfer transistor drive line LD111.

For example, when the transfer control signal TRG at a high level is input to the gate of the transfer transistor 111, the charge accumulated in the photodiode PD is transferred to the floating diffusion layer FD. On the other hand, when the transfer control signal TRG at a low level is supplied to the gate of the transfer transistor 111, the transfer of the charge from the photodiode PD is stopped.

As described above, the floating diffusion layer FD has a function of converting the charge transferred from the photodiode PD via the transfer transistor 111 into the voltage of the voltage value corresponding to the amount of charge. Therefore, in the floating state in which the reset transistor 112 is turned off, a potential of the floating diffusion layer FD is modulated according to the amount of charge accumulated therein.

The amplification transistor 113 functions as an amplifier using a potential variation of the floating diffusion layer FD connected to the gate thereof as an input signal, and an output voltage signal thereof appears as the pixel signal in the vertical signal line VSL via the selection transistor 114.

The selection transistor 114 controls appearance of the pixel signal by the amplification transistor 113 in the vertical signal line VSL according to a selection control signal SEL supplied from the vertical drive circuit 102 via the selection transistor drive line LD114. For example, when the selection control signal SEL at a high level is input to the gate of the selection transistor 114, the pixel signal by the amplification transistor 113 appears in the vertical signal line VSL. On the other hand, when the selection control signal SEL at a low level is input to the gate of the selection transistor 114, the appearance of the pixel signal in the vertical signal line VSL is stopped. Thus, it is possible to extract only an output of the selected unit pixel 110 in the vertical signal line VSL to which the plurality of unit pixels 110 are connected.

1.5 Stacked Configuration Example of Image Sensor

Figure 4:
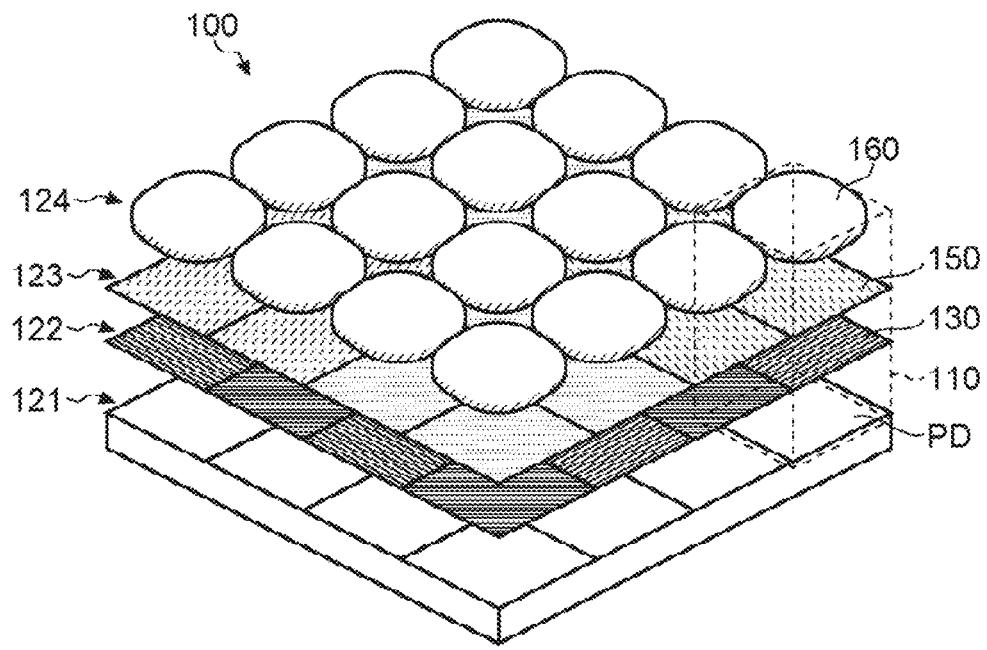
FIG. 4 is a perspective view illustrating a stacked configuration example of the solid-state imaging apparatus according to the embodiment.

FIG. 4 is a perspective view illustrating a stacked configuration example of the image sensor according to the embodiment. Note that in FIG. 4 and the following description, for the sake of simplicity, a case where the image sensor 100 is 4×4 pixels will be exemplified.

As illustrated in FIG. 4, the image sensor 100 includes a semiconductor chip 121, a convolution filter array 122, a color filter array 123, and a microlens array 124. Note that in FIG. 4, the semiconductor chip 121, the convolution filter array 122, the color filter array 123, and the microlens array 124 are illustrated as being separated in a stacking direction, but actually, the semiconductor chip 121, the convolution filter array 122, the color filter array 123, and the microlens array 124 are built as one chip.

The semiconductor chip 121 includes, for example, components exemplified in FIG. 2 in the solid-state imaging apparatus 100, and the pixel circuit exemplified in FIG. 3. The semiconductor chip 121 may include one die, or may be a laminated chip in which a plurality of dies are bonded. On the light receiving surface of the semiconductor chip 121, a plurality of the photodiodes PD constituting the pixel array unit 101 are arranged in a matrix.

For example, the convolution filter array 122 is provided on the light receiving surface of the semiconductor chip 121. The convolution filter array 122 has, for example, a configuration in which convolution filters (first filters) 130 corresponding to the respective photodiodes PD on a one-to-one basis are arranged in a matrix.

For example, the color filter array 123 is provided on the convolution filter array 122. The color filter array 123 has, for example, a configuration in which color filters (second filters) 150 corresponding to the respective photodiodes PD on a one-to-one basis are arranged in a matrix.

Note that a repeating unit pattern (hereinafter, referred to as a color filter unit) of the color filter array 123 according to the present embodiment may be a Bayer array of 2×2 pixels including one red (R) pixel, one blue (B) pixel, and two green (G) pixels. However, it is not limited thereto, and for example, various color filter arrays such as a 3×3 pixel color filter array (hereinafter, referred to as an X-Trans (registered trademark) type array) adopted in an X-Trans (registered trademark) CMOS sensor, a 4×4 pixel quad Bayer array (also referred to as a quadrature array), and a 4×4 pixel color filter (hereinafter, referred to as a white RGB array) obtained by combining a white RGB color filter with the Bayer array can be adopted.

For example, the microlens array 124 is provided on the color filter array 123. The microlens array 124 has, for example, a configuration in which on-chip lenses 160 corresponding to the respective photodiodes PD on a one-to-one basis are arranged in a matrix. However, it is not limited to such a configuration, and one on-chip lens 160 may be associated with two or more photodiodes PD. That is, one on-chip lens 160 may be shared by two or more unit pixels 110.

According to the above configuration, each unit pixel 110 includes the pixel circuit formed in the semiconductor chip 121, the convolution filter 130 on the photodiode PD in the pixel circuit, the color filter 150 on the convolution filter 130, and the on-chip lens 160 on the color filter 150.

1.5.1 Modification

Figure 5:
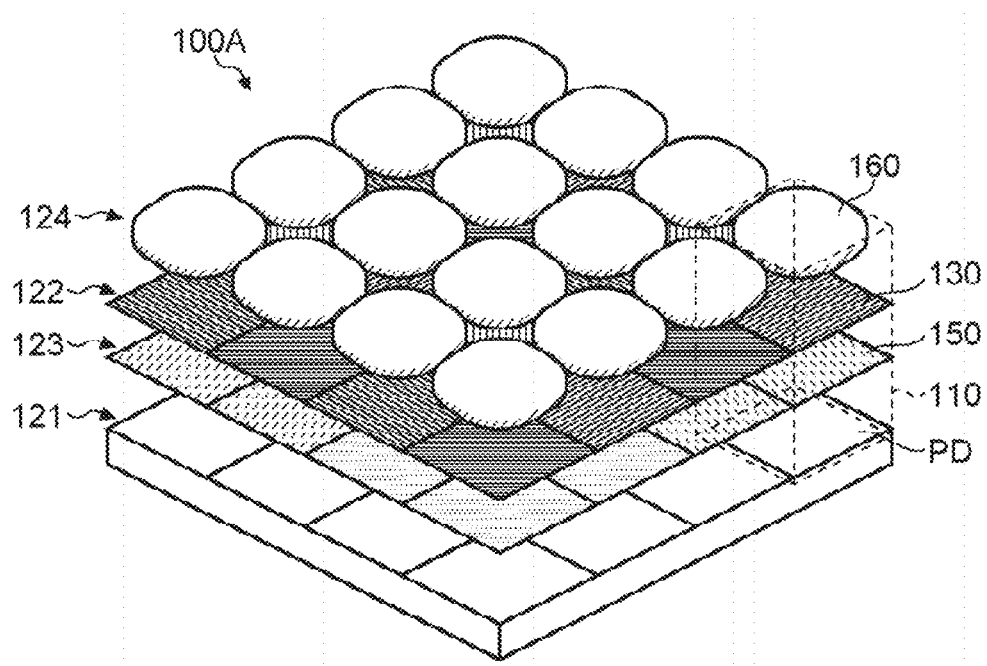
FIG. 5 is a perspective view illustrating the stacked configuration example of the solid-state imaging apparatus according to a modification of the embodiment.

Note that a position of the convolution filter array 122 is not limited to a position between the semiconductor chip 121 and the color filter array 123 as illustrated in FIG. 4. For example, as in an image sensor 100A exemplified in FIG. 5, the convolution filter array 122 may be disposed between the color filter array 123 and the microlens array 124.

1.6 Application Example of Optical Convolution Operation

The convolution filter array 122 according to the present embodiment has, for example, a physical configuration that optically performs the convolution operation on an image (hereinafter, referred to as an incident image) of the light incident on the array (pixel array unit 101) of the unit pixel 110 (specifically, the photodiode PD). In the present description, the convolution operation performed using the convolution filter array 122 is referred to as the optical convolution operation.

Here, an application example of the convolution operation will be described using a convolution neural network (CNN) which is one of DNNs.

Figure 6:
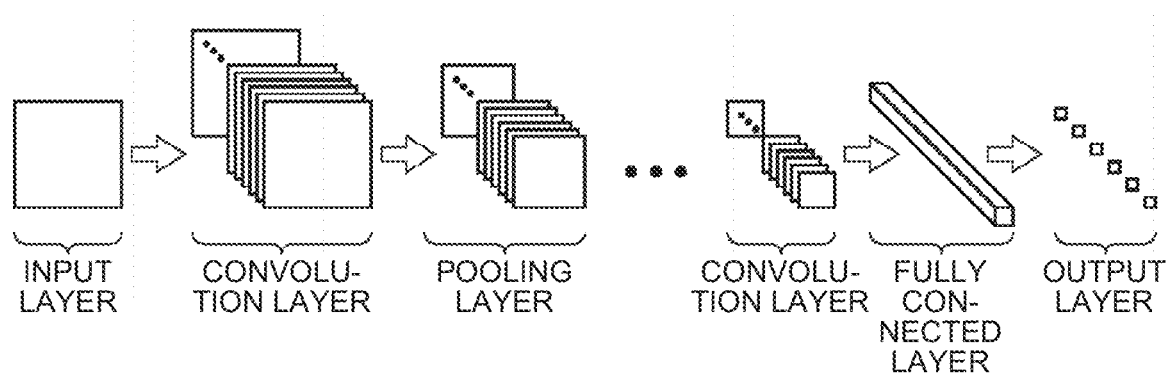
FIG. 6 is a diagram for explaining a general CNN.

FIG. 6 is a diagram for explaining a general CNN. As illustrated in FIG. 6, the CNN includes an input layer, a plurality of convolution layers and pooling layers that are alternately repeated, a fully connected layer, and an output layer.

The optical convolution operation performed using the convolution filter array 122 according to the present embodiment can be applied to, for example, the convolution layer corresponding to a first layer in FIG. 6. In this case, the data input to the input layer of the CNN may be the incident image on the image sensor 100.

However, the optical convolution operation performed using the convolution filter array 122 according to the present embodiment is not limited to the CNN in which the first layer is the convolution layer, and can be applied to various types of processing of performing the convolution operation for an input, that is, for the incident image on the image sensor 100.

1.7 Overview of CNN

Here, an overview of the first layer of the CNN to which the optical convolution operation according to the embodiment can be applied will be described.

Figure 7:
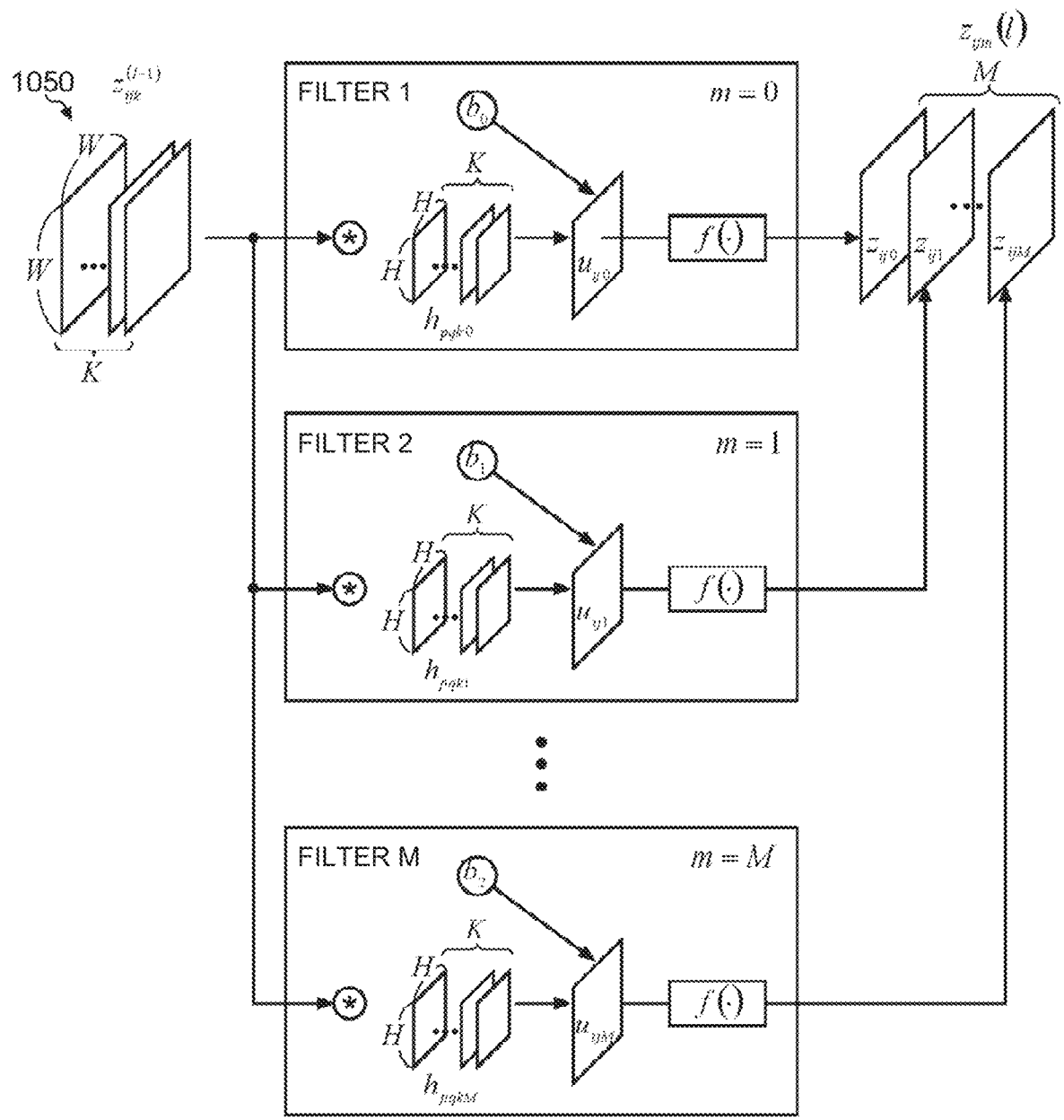
FIG. 7 is a diagram for describing an overview of a convolution layer which is a first layer of the CNN.

FIG. 7 is a diagram for describing an overview of the convolution layer which is the first layer of the CNN. Note that FIG. 7 exemplifies a case where frame data 1050 in which the number of channels is K and frame data of each channel is W×W pixels is provided to the input layer. Note that the number of channels corresponds to, for example, the number of color components (three) of RGB three primary colors to be described later, and in the present description, K=3. M corresponds to, for example, the number of types of the convolution filter 130 to be described later.

As illustrated in FIG. 7, the convolution layer located in the first layer receives K channel data $z^{(l-1)}_{ijk}$ (k=0, ..., K−1) from the immediately preceding 1-1 layer. In the first convolution layer, the convolution operation using M kinds of filters $_{hpqkm}$ (m=0, ..., M−1) is performed on the received $z^{(l-1)}_{ijk}$.

Each filter $_{hpqkm}$ (m=0, ..., M−1) has the same number of channels K as the input, and its size is, for example, H×H×K. In FIG. 7, calculations are performed in parallel on M filters $_{hpqkm}$ (m=0, ..., M−1) of m=0 to M, and an output $u_{ijk}$ is obtained for each channel.

After completion of such a convolution operation, results are added across all channels for each variable. This addition can be expressed by the following equation (1). Note that in the equation (2), $b_{ijm}$ is a bias, and may be common to all the units for each filter.

$$u_{ijm} = \sum_{k=0}^{K-1}\sum_{p=0}^{H-1}\sum_{q=0}^{H-1} z_{i+p,j-q,k}^{(l-1)} h_{pqkm} + b_{ijm} \quad (1)$$

Then, an activation function is applied to the output $u_{ijm}$ obtained as described above. Thus, a value represented by the following equation (2) is a final output and is propagated to a next layer. Note that in the next layer, a size of the input changes from W×W×K to W×W×M.

$$z_{ijm} = f(u_{ijm}) \quad (2)$$

1.8 Application to the Present Embodiment

Figure 8:
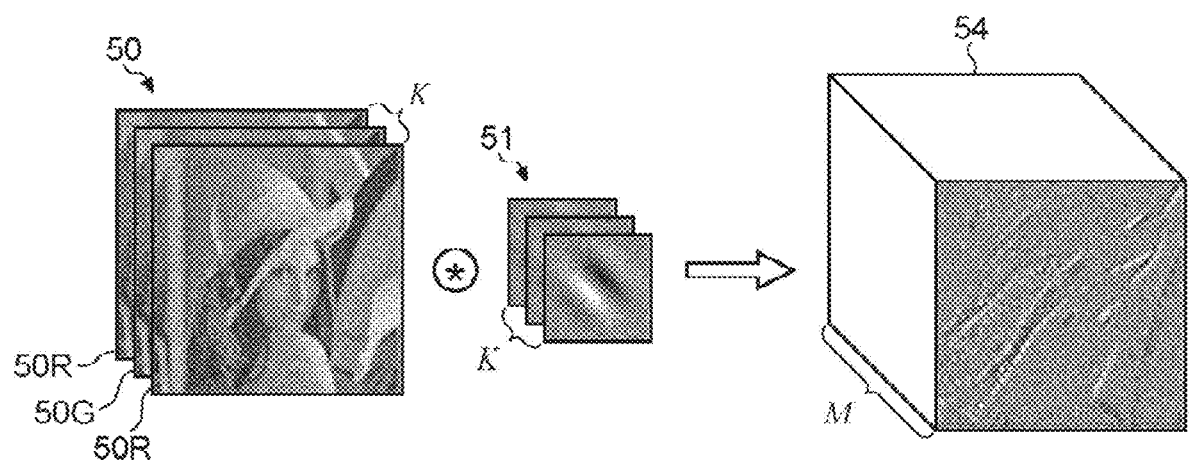
FIG. 8 is a diagram for explaining a case where the embodiment is applied to the convolution layer which is the first layer of the CNN.

Next, a case where the embodiment is applied to the CNN described above will be described. FIG. 8 is a diagram for explaining a case where the present embodiment is applied to the convolution layer which is the first layer of the CNN.

As illustrated in FIG. 8, in the case where the present embodiment is applied to the first layer of the CNN, frame data 50 including frame data 50R, 50G, and 50B for the color components of the RGB three primary colors is provided to the input layer. In this case, the number of channels K in FIG. 7 is three of R, G, and B. Further, a size of each of the frame data 50R, 50G, and 50B corresponds to W×W.

In the present embodiment, the frame data 50 provided to the input layer may be, for example, an image of the incident light incident on the photodiodes PD arranged in the pixel array unit 101 of the image sensor 100. Further, a filter 51 corresponding to the filter$_{hpqkm}$ (m=0, ..., M−1) may be, for example, the convolution filter array 122.

According to such a convolution operation, a feature map 54 for the number of types M of the convolution filter 130 is obtained as the output $u_{ijm}$. The feature map 54 is input to, for example, an external data processing unit or data processing device such as the signal processing circuit 108, the signal processing unit 13, the DSP 14, the application processor 20, or the cloud server 30, and the CNN is performed from the pooling layer of the second layer.

Note that the data input to the input layer is not limited to the frame data 50 for one page, and may be data for one or several pixels, one line, or a specific region (region of interest (ROI)). In that case, the optical convolution operation according to the present embodiment may be applied to another DNN such as a recurrent neural network (RNNN) instead of the CNN.

1.9 Convolution Filter

For example, a diffraction grating using Talbot diffraction (also referred to as a Talbot diffraction grating) can be used for each convolution filter 130 constituting the convolution filter array 122 that performs such an optical convolution operation.

Figure 9:
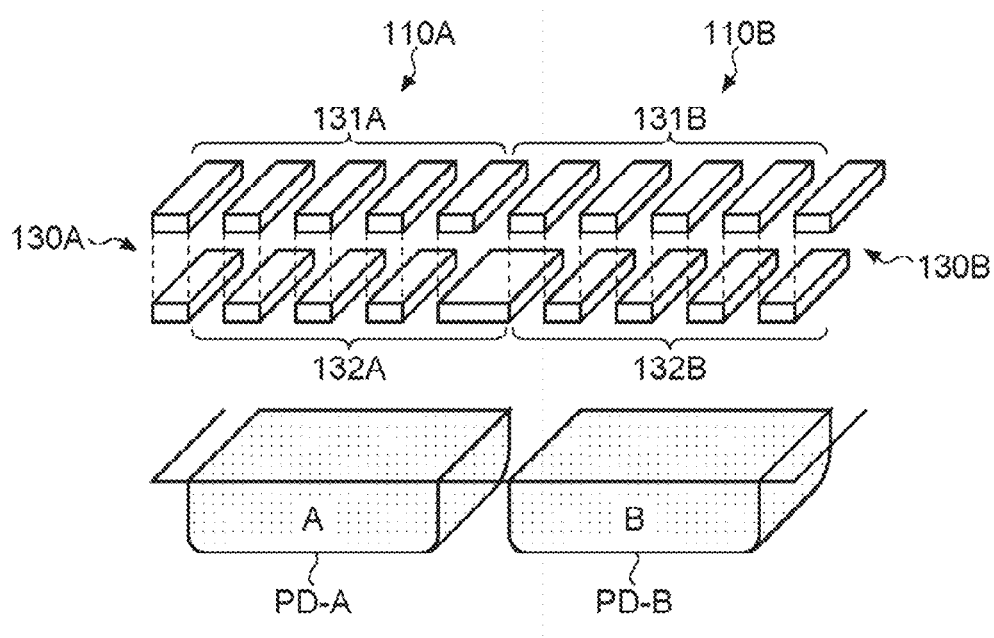
FIG. 9 is a diagram illustrating an example of a convolution filter according to the embodiment.

FIG. 9 is a diagram illustrating an example of the convolution filter according to the embodiment. Note that FIG. 9 illustrates two unit pixels 110A and 110B used in a pair.

As illustrated in FIG. 9, a convolution filter 130A provided in one unit pixel 110A includes a diffraction grating 131A arranged in an upper stage (upstream side in a path of the incident light) and a diffraction grating 132A arranged in a lower stage (downstream side in the path of the incident light).

The diffraction gratings 131A and 132A may have, for example, the same phase, the same pitch, and the same direction. Note that the direction may be, for example, a direction of inclination with respect to the row direction of the unit pixels 110 arranged in a matrix on an arrangement surface of the unit pixels 110 (a light receiving surface of the photodiode PD) in the pixel array unit 101.

Furthermore, a convolution filter 130B provided in the other unit pixel 110B similarly includes a diffraction grating 131B arranged in the upper stage (upstream side in the path of the incident light) and a diffraction grating 132B arranged in the lower stage (downstream side in the path of the incident light).

The diffraction gratings 131B and 132B may have, for example, the same pitch and the same direction. In addition, the diffraction gratings 131A and 132A and the diffraction gratings 131B and 132B may have the same pitch and the same direction. However, phases of the diffraction gratings 131B and 132B are shifted by 180°.

Furthermore, as a material of the diffraction gratings 131A, 132A, 131B, and 132B, for example, a light shielding material such as tungsten (W) can be used. However, it is not limited thereto, and various reflective materials and light shielding materials can be used.

1.10 Functional Example of Convolution Filter Array

In this way, by arranging the convolution filters 130A or 130B in which the diffraction gratings 131A and 132A or the diffraction gratings 131B and 132B having the same pitch and the same direction are arranged one above the other at predetermined intervals on the light receiving surface of the photodiode PD-A or PD-B, it is possible to transfer the images of the diffraction gratings 131A and 132A or the diffraction gratings 131B and 132B to the light receiving surface of the photodiode PD-A or PD-B. That is, by using the Talbot diffraction grating, it is possible to configure the convolution filters 130A and 130B that selectively transmit an edge component in a predetermined direction in each incident image.

At that time, the image formed on the light receiving surface of the photodiode PD-A or PD-B is affected by light density of the incident image. Therefore, on the light receiving surface of the photodiode PD-A or PD-B, a component (hereinafter, referred to as an edge component) having the same direction as that of the diffraction gratings 131A and 132A or the diffraction gratings 131B and 132B, and having the same cycle (hereinafter, also referred to as a frequency) as that of the diffraction gratings 131A and 132A or the diffraction gratings 131B and 132B, of the incident image, is imaged.

Figure 10:
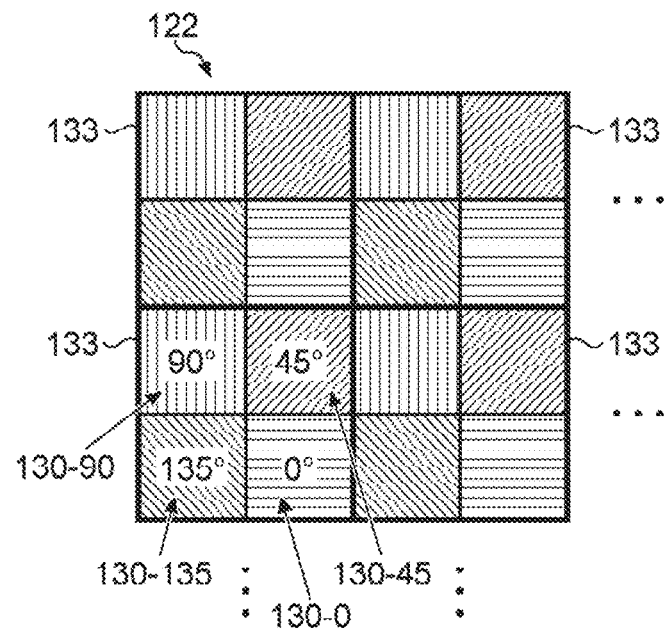
FIG. 10 is a diagram illustrating an example of a convolution filter array according to the embodiment.

Therefore, for example, as illustrated in FIG. 10, in a case of using the convolution filter array 122 in which unit patterns (hereinafter, referred to as convolution filter units) 133 in which four convolution filters 130-0, 130-45, 130-90, and 130-135 different in direction by 45° are arranged in a 2×2 matrix are repeated, it is possible to acquire an edge component inclined by 0° with respect to the row direction (that is, parallel to the row direction), an edge component inclined by 45°, an edge component inclined by 90°, and an edge component inclined by 135° as the binary data.

The convolution filter array 122 including the convolution filter 130 having such characteristics can perform a function similar to that of a Gabor filter. That is, in the present embodiment, the Gabor filter is physically implemented using the convolution filters 130A and 130B using Talbot diffraction.

Then, by arranging the convolution filter array 122 functioning as the Gabor filter with respect to the incident image, for example, a result (the binary data) of the optical convolution operation using the Gabor filter can be directly acquired. Thus, for example, since the convolution layer of the first layer in the CNN can be omitted and the processing can be performed from the pooling layer of the second layer, higher speed image recognition processing can be performed.

Note that by making the phase of one convolution filter 130A in phase and the phase of the other convolution filter 130B in opposite phase, and performing subtraction between the pixel values obtained from the respective unit pixels 110A and 110B, it is possible to remove a direct current (DC) component (also referred to as a constant component) from the pixel value (binary data) obtained as the result of the optical convolution operation. However, it is not essential to remove the DC component from the edge component.

Furthermore, even in a case where the DC component is removed, the unit pixel 110A provided with the convolution filter 130A and the unit pixel 110B provided with the convolution filter 130B are not necessarily adjacent to each other.

1.11 Relationship Between Pattern and Frequency Spectrum of Convolution Filter Array Here, a relationship between a pattern and a frequency spectrum of the convolution filter array 122 according to the present embodiment will be described with reference to the drawings.

Figure 11:
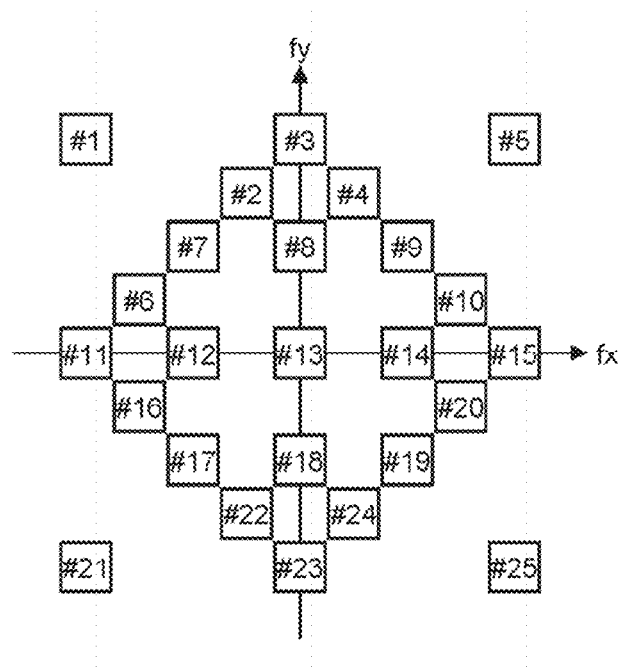
FIG. 11 is a diagram illustrating an example of a frequency spectrum of an edge component acquired by the convolution filter array according to the embodiment.
Figure 12:
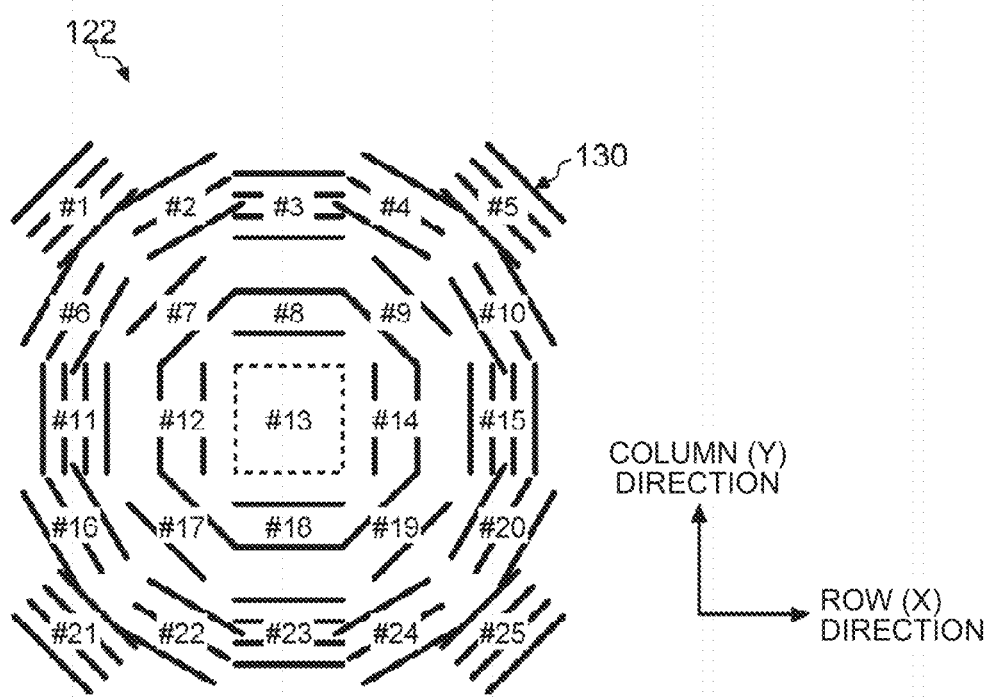
FIG. 12 is a schematic diagram illustrating an example of a convolution filter unit constituting the convolution filter array capable of acquiring the edge component of the frequency spectrum illustrated in FIG. 11.

FIG. 11 is a diagram illustrating an example of the frequency spectrum of the edge component acquired by the convolution filter array according to the embodiment. FIG. 12 is a schematic diagram illustrating an example of the convolution filter unit constituting the convolution filter array capable of acquiring the edge component of the frequency spectrum illustrated in FIG. 11.

In FIG. 11, a horizontal axis represents a frequency fx in the row direction, and a vertical axis represents a frequency fy in the column direction. In the example illustrated in FIG. 11, a total of 25 types of different edge components #1 to #25 are acquired.

In FIGS. 11 and 12, reference numerals #1 to #25 correspond to each other. Therefore, in order to obtain the frequency spectrum illustrated in FIG. 11, as illustrated in FIG. 12, the convolution filter array 122 includes 25 different convolution filters 130 (#1 to #25).

In FIG. 11, the edge component #13 may be, for example, the DC component. In this case, the edge component #13 does not include direction information and frequency information. As illustrated in FIG. 12, the convolution filter 130 (#13) for acquiring such an edge component #13 includes an empty region not including the diffraction grating.

In FIG. 11, the edge components #7, #8, #9, #12, #14, #17, #18, and #19 may be, for example, low-frequency edge components. In this case, the pitch of the diffraction gratings constituting the convolution filters 130 (#7, #8, #9, #12, #14, #17, #18 and #19) for acquiring the edge components #7, #8, #9, #12, #14, #17, #18, and #19 is widely set as illustrated in FIG. 12. In the present description, this pitch is referred to as a first pitch.

In FIG. 11, the edge components #1, #3, #5, #11, #15, #21, #23, and #25 may be, for example, high-frequency edge components narrower than the first pitch. In this case, the pitch of the diffraction gratings constituting the convolution filters 130 (#1, #3, #5, #11, #15, #21, #23 and #25) for acquiring the edge components #1, #3, #5, #11, #15, #21, #23, and #25 is set to a second pitch narrower than the first pitch as illustrated in FIG. 12.

In FIG. 11, the edge components #2, #4, #6, #10, #16, #20, #22, and #24 may be, for example, edge components of an intermediate frequency between the first pitch and the second pitch. In this case, the pitch of the diffraction gratings constituting the convolution filters 130 (#2, #4, #6, #10, #16, #20, #22 and #24) for acquiring the edge components #2, #4, #6, #10, #16, #20, #22, and #24 is set to a third pitch which is an intermediate pitch between the first pitch and the second pitch as illustrated in FIG. 12.

Furthermore, in FIG. 11, the edge components #3, #8, #18, and #23 may be the edge components parallel to the row direction (inclination θ=0°). In this case, the inclination θ of the diffraction gratings constituting the convolution filters 130 (#3, #8, #18 and #23) for acquiring the edge components #3, #8, #18, and #23 with respect to the row direction may be 0° as illustrated in FIG. 12.

In FIG. 11, the edge components #11, #12, #14, and #15 may be the edge components perpendicular to the row direction (inclination θ=90°). In this case, the inclination θ of the diffraction gratings constituting the convolution filters 130 (#11, #12, #14 and #15) for acquiring the edge components #11, #12, #14, and #15 with respect to the row direction may be 90° as illustrated in FIG. 12.

In FIG. 11, the edge components #5, #9, #17, and #21 may be the edge components inclined by 45° with respect to the row direction. In this case, the inclination θ of the diffraction gratings constituting the convolution filters 130 (#5, #9, #17 and #21) for acquiring the edge components #5, #9, #17, and #21 with respect to the row direction may be 45° as illustrated in FIG. 12.

In FIG. 11, the edge components #1, #7, #19, and #25 may be the edge components inclined by 135° with respect to the row direction. In this case, the inclination θ of the diffraction gratings constituting the convolution filters 130 (#1, #7, #19 and #25) for acquiring the edge components #1, #7, #19, and #25 with respect to the row direction may be 135° as illustrated in FIG. 12.

In FIG. 11, the edge components #10 and #16 may be the edge components inclined by 22.5° with respect to the row direction. In this case, the inclination θ of the diffraction gratings constituting the convolution filters 130 (#10 and #16) for acquiring the edge components #10 and #16 with respect to the row direction may be 22.5° as illustrated in FIG. 12.

In FIG. 11, the edge components #4 and #22 may be the edge components inclined by 67.5° with respect to the row direction. In this case, the inclination θ of the diffraction gratings constituting the convolution filters 130 (#4 and #22) for acquiring the edge components #4 and #22 with respect to the row direction may be 67.5° as illustrated in FIG. 12.

In FIG. 11, the edge components #2 and #24 may be the edge components inclined by 112.5° with respect to the row direction. In this case, the inclination θ of the diffraction gratings constituting the convolution filters 130 (#2 and #24) for acquiring the edge components #2 and #24 with respect to the row direction may be 112.5° as illustrated in FIG. 12.

In FIG. 11, the edge components #6 and #20 may be the edge components inclined by 157.5° with respect to the row direction. In this case, the inclination θ of the diffraction gratings constituting the convolution filters 130 (#6 and #20) for acquiring the edge components #6 and #20 with respect to the row direction may be 157.5° as illustrated in FIG. 12.

As described above, in the present embodiment, the convolution filter array 122 is configured using a plurality of types of convolution filters 130 having different pitches and directions of diffraction gratings. This makes it possible to acquire the binary data of a plurality of types of edge components having different directions and frequencies in one imaging.

Note that in the frequency spectrum illustrated in FIG. 11, the edge components #14 to #25 substantially overlap the edge components #1 to #12. Therefore, it is also possible to configure not to acquire either the edge components #14 to #25 or the edge components #1 to #12. In this case, the convolution filters 130 of #14 to #25 or #1 to #12 in the convolution filter array 122 illustrated in FIG. 12 can be omitted.

Alternatively, in order to acquire more types of edge components, the pitch and/or the direction of the diffraction grating constituting each of the convolution filters 130 of #14 to #25 may be different from the pitch and/or the direction of the diffraction grating constituting each of the convolution filters 130 of #1 to #12. Such a convolution filter array 122 can be implemented, for example, by being configured not to be point symmetric with respect to a center of an empty convolution filter 130 (#13) for acquiring a centrally located DC component.

Alternatively, by configuring the diffraction grating constituting the convolution filter 130 with a controllable optical element such as a liquid crystal, the convolution filter array 122 including the convolution filter 130 having a pitch and a direction dynamically changeable may be configured.

1.12 Configuration Example of Combination Filter

In the present embodiment, by combining the above-described convolution filter array 122 and the color filter array 123, the edge components corresponding to the number of types of the convolution filters 130 are acquired for each color component of the RGB three primary colors. Note that in the following description, it is assumed that the convolution filter 130 and the photodiode PD are associated on a one-to-one basis.

Figure 13:
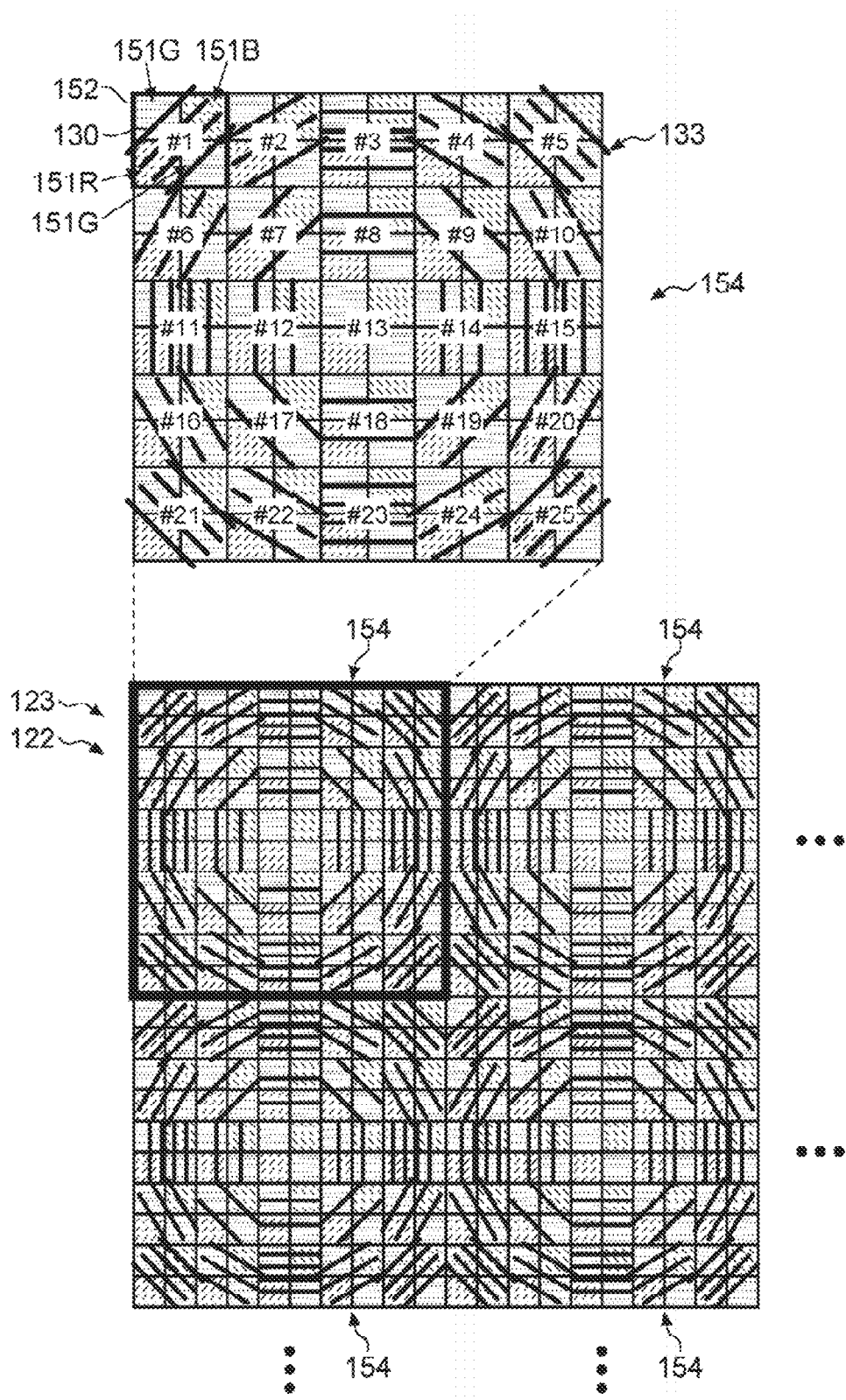
FIG. 13 is a plan view illustrating a schematic configuration example of a combination filter in which the convolution filter array and a color filter array according to the embodiment are combined.
Figure 14:
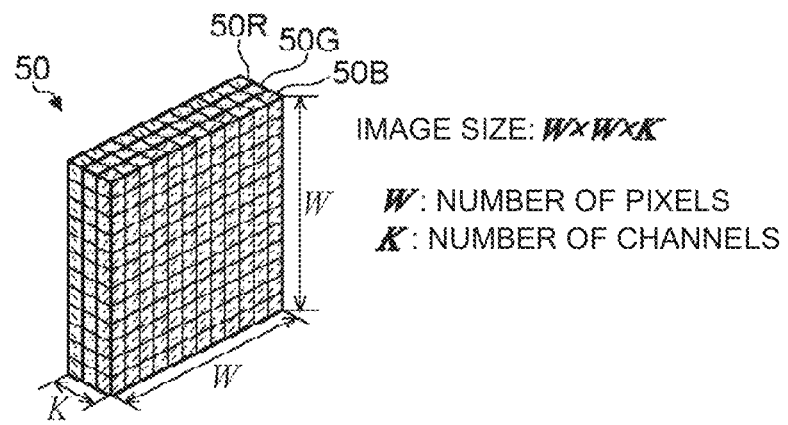
FIG. 14 is a diagram illustrating an example of frame data generated by an image sensor according to the embodiment.

FIG. 13 is a plan view illustrating a schematic configuration example of a combination filter in which the convolution filter array and the color filter array according to the embodiment are combined. FIG. 14 is a diagram illustrating an example of the frame data generated by the image sensor according to the embodiment.

As illustrated in FIG. 13, the color filter array 123 has, for example, a configuration in which color filter units 152 in the Bayer array including four color filters 151R, 151G, and 151B are arranged in a matrix.

Each convolution filter 130 constituting the convolution filter array 122 is arranged one-to-one with respect to each color filter unit 152 of the color filter array 123. Therefore, in a unit pattern (hereinafter, referred to as a combination filter unit) 154 of the combination filter, a total of 25 color filter units 152 are combined with the convolution filter unit 133 including a total of 25 convolution filters 130 of #1 to #25.

According to such a configuration, as illustrated in FIG. 14, in the image sensor 100, the frame data 50R, 50G, and 50B including 25 types of edge components are generated for each color component of the RGB three primary colors.

Note that in FIG. 14, K is the number of channels, and in the present description, K is the number of color components of the RGB three primary colors, that is, '3'. Furthermore, W is the number of pixels of the frame data 50R, 50G, and 50B generated by the image sensor 100 for each color component. For example, in a case where the color filter array 123 of the image sensor 100 includes a total of 2500 color filter units 152 of 50×50, W is '50'. Note that in FIG. 14, each of the frame data 50R, 50G, and 50B is a W×W rectangle, but the rectangle is not essential.

1.12.1 Modification of Combination Filter

Figure 15:
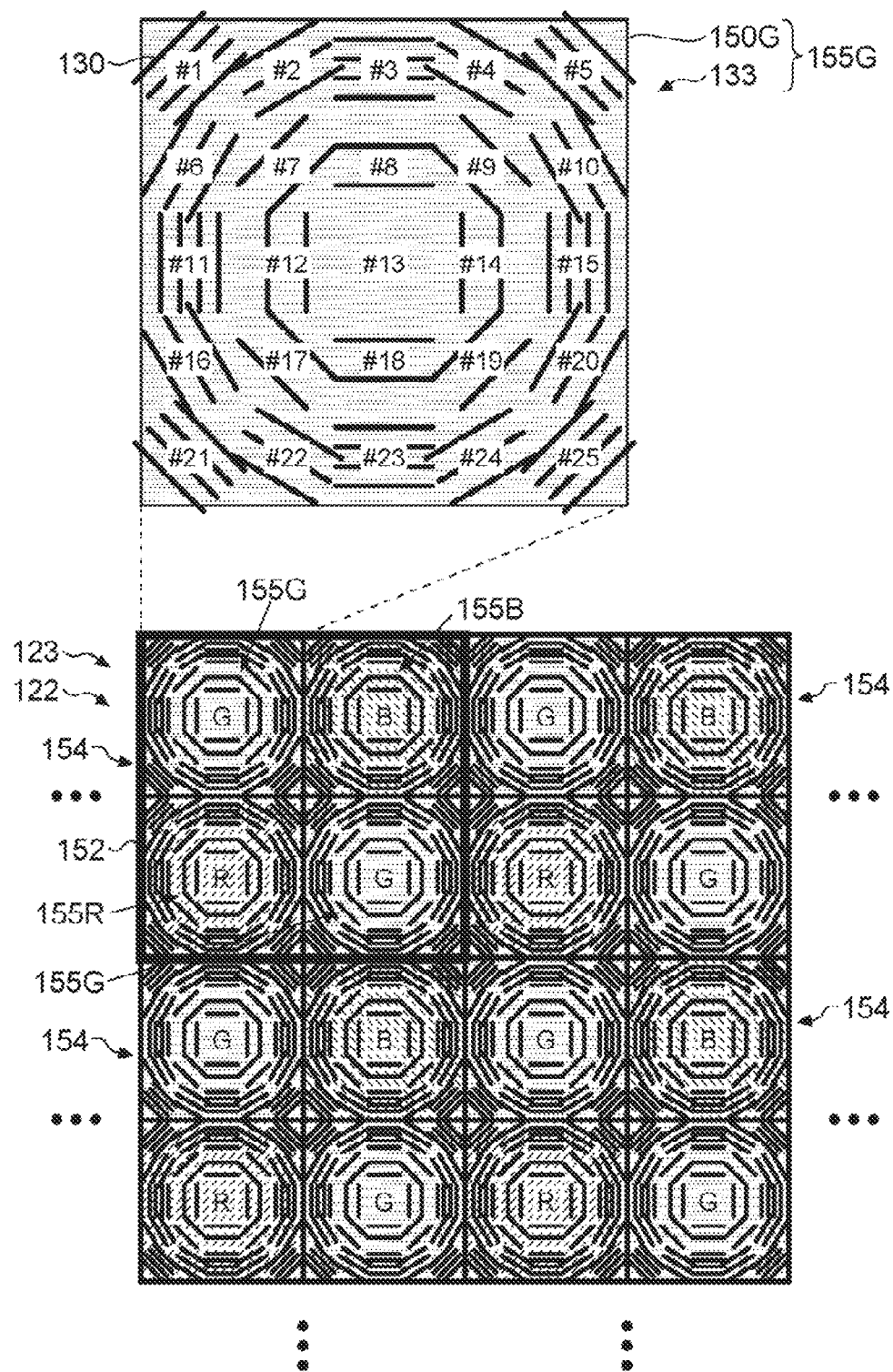
FIG. 15 is a plan view illustrating the schematic configuration example of the combination filter according to the modification of the embodiment.

Furthermore, FIG. 13 exemplifies a case where one color filter unit 152 is combined with one convolution filter 130, but a configuration of the combination filter is not limited to such a configuration. FIG. 15 is a plan view illustrating the schematic configuration example of the combination filter according to a modification of the embodiment.

As illustrated in FIG. 15, the combination filter according to the present modification has a configuration in which one convolution filter unit 133 is combined with one color filter 150. Note that FIG. 15 illustrates an enlarged view of a G component combination filter unit 155G formed by combining the convolution filter unit 133 with a G component color filter 150G, however, the convolution filter unit 133 is similarly combined with other R component color filter 150 and B component color filter 150 to form an R component combination filter unit 155R and a B component combination filter unit 155B.

Even with such a configuration, similarly to the combination filter exemplified in FIG. 13, the frame data 50R, 50G, and 50B including 25 types of edge components can be acquired for each color component of the RGB three primary colors (see FIG. 14).

1.13 Overview of Convolution Operation (without Color Filter)

Figure 16:
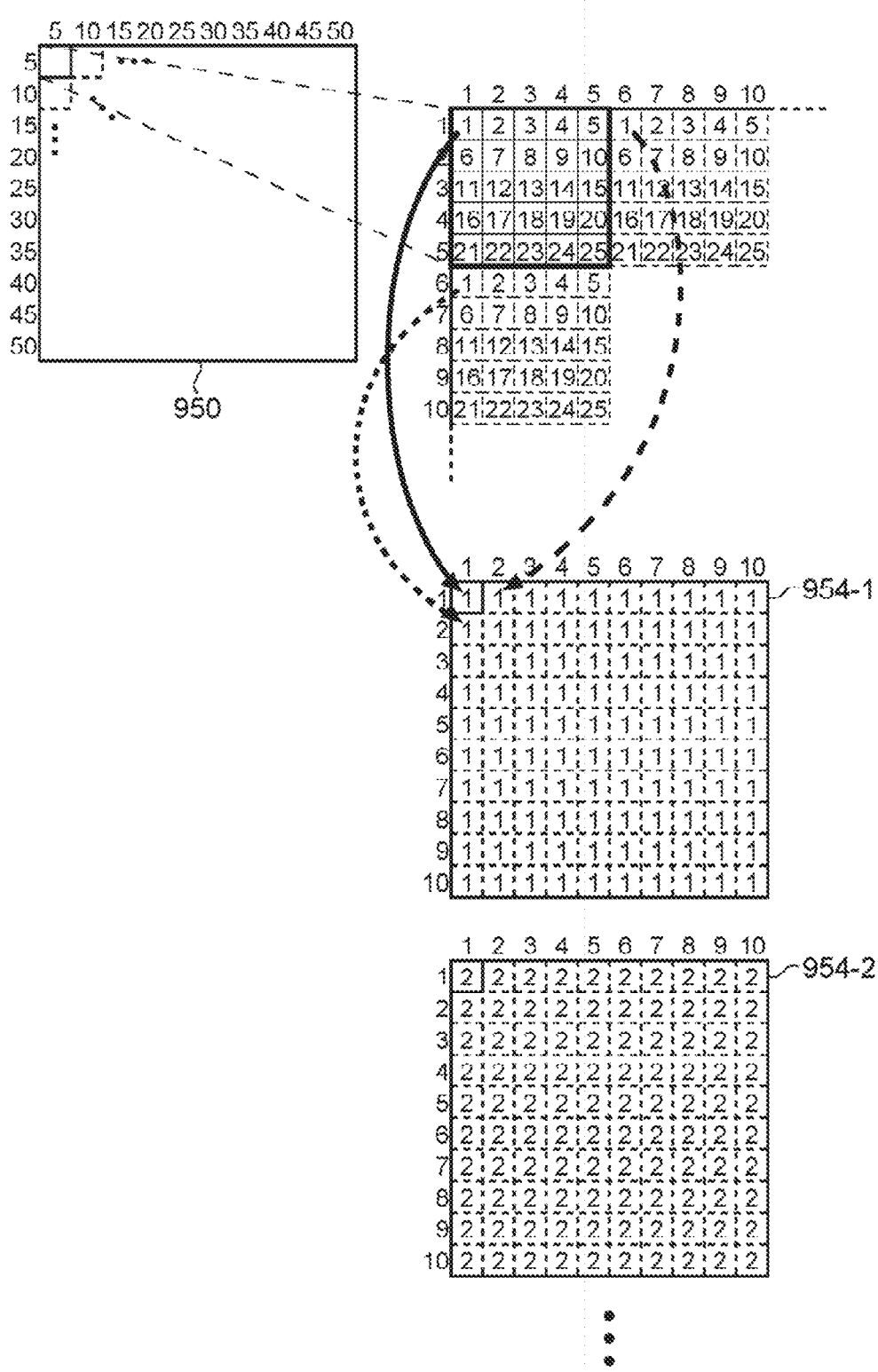
FIG. 16 is a diagram for explaining an overview of an optical convolution operation according to the embodiment.

Next, an overview of the convolution operation will be described. FIG. 16 is a diagram for explaining the overview of the optical convolution operation according to the embodiment. Note that the convolution operation in a case where the image sensor 100 does not include the color filter array 123 will be described below.

As illustrated in FIG. 16, in a case where the image sensor 100 does not include the color filter array 123, the charge corresponding to the edge components according to an arrangement of the convolution filters 130 in the convolution filter array 122 is accumulated in each photodiode PD in the pixel array unit 101 of the image sensor 100. Therefore, in a case where reading is performed for all the unit pixels 110 of the pixel array unit 101, frame data 950 in which the edge components are arranged according to the arrangement of the convolution filters 130 is read.

Therefore, in the present embodiment, for example, the reading is performed for each type (direction and frequency) of the convolution filter 130 with respect to the pixel array unit 101. For example, in a case where there are a total of 25 types of convolution filters 130 of #1 to #25, the reading is performed 25 times in total in order from #1. By such a read operation, feature maps 954-1 to 954-25 (binary data) for each type of the convolution filter 130 can be read as a result of the optical convolution operation.

Note that the convolution from the frame data 950 to the feature maps 954-1 to 954-25 is not limited to the above-described read control, and may be performed by, for example, the external data processing unit or data processing device such as the signal processing circuit 108, the signal processing unit 13, or the DSP 14.

1.14 Overview of Convolution Operation (with Color Filter)

Figure 17:
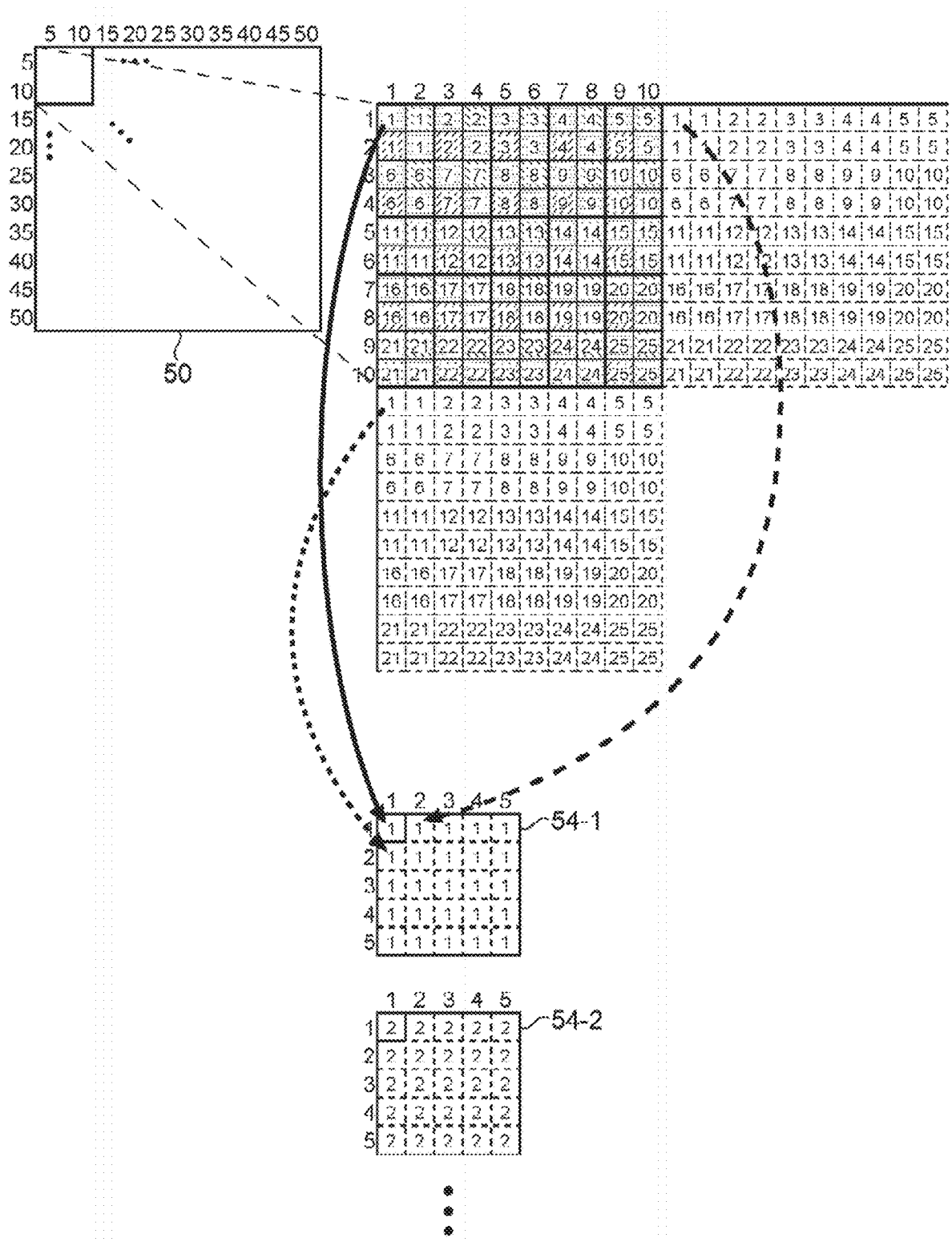
FIG. 17 is a diagram for explaining the overview of the optical convolution operation (with color filter) according to the embodiment.

Next, an overview of the convolution operation in a case where the color filter array 123 is provided will be described. FIG. 17 is a diagram for explaining the overview of the optical convolution operation (with color filter) according to the embodiment.

As illustrated in FIG. 17, in a case where the convolution filter array 122 and the color filter array 123 are combined, charges corresponding to the number of types of the edge components of the convolution filters 130 are accumulated for each color component of the RGB three primary colors in each photodiode PD of the pixel array unit 101.

Therefore, in the present embodiment, for example, the reading for each type of the convolution filter 130 is performed for each of the RGB three primary colors with respect to the pixel array unit 101. For example, in a case where there are a total of 25 types of convolution filters 130 of #1 to #25 and there are three types of color filters 150 of the RGB three primary colors, first, the reading is performed 25 times in total for the unit pixel 110 including the color filter 150 that selectively transmits the R component in order from the unit pixel 110 including the convolution filter 130 of #1, then the reading is performed 25 times in total for the unit pixel 110 including the color filter 150 that selectively transmits the G component in order from the unit pixel 110 including the convolution filter 130 of #1, and finally, the reading is performed 25 times in total for the unit pixel 110 including the color filter 150 that selectively transmits the B component in order from the unit pixel 110 including the convolution filter 130 of #1. Note that a reading order for each of RGB components and the reading order for the unit pixel 110 including the convolution filters 130 of #1 to #25 are merely examples.

By such a reading operation, the feature maps 54-1 to 54-25 (binary data) for each type of the convolution filter 130 can be read as the result of the optical convolution operation for each color component of the RGB three primary colors.

1.14.1 Modification of Convolution Operation

Note that the convolution from the frame data 50 to the feature maps 54-1 to 54-25 for each color component is not limited to a method of directly reading the feature maps 54-1 to 54-25 from the pixel array unit 101 as described above, and may be performed by, for example, the signal processing circuit 108, the signal processing unit 13, the DSP 14, or the like. At that time, the external data processing unit or data processing device such as the signal processing circuit 108, the signal processing unit 13, or the DSP 14 may perform demosaic processing on the frame data 50 read from the pixel array unit 101 to create the frame data for each color component.

FIGS. 18 to 21 are diagrams for explaining an overview of the convolution operation according to the modification of the embodiment. Note that in the following description, a case where the signal processing circuit 108 performs the demosaic processing will be described as an example.

Figure 18:
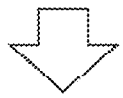
FIG. 18 is a diagram for explaining the overview of the convolution operation according to the modification of the embodiment (part 1).

First, as illustrated in FIG. 18, the signal processing circuit 108 extracts the pixel signal read from the unit pixel 110 including the color filter 150 that selectively transmits a wavelength of the R component from the frame data 50 read from the pixel array unit 101, thereby generating the frame data 50R including the pixel signal of the R component. Note that by this demosaic processing, resolution of the frame data 50R is reduced to the resolution in each of the color filter units 152.

Figure 19:
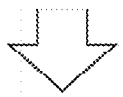
FIG. 19 is a diagram for explaining the overview of the convolution operation according to the modification of the embodiment (part 2).

Subsequently, as illustrated in FIG. 19, the signal processing circuit 108 extracts the pixel signal read from the unit pixel 110 including the color filter 150 that selectively transmits the wavelength of the G component from the frame data 50 read from the pixel array unit 101, thereby generating frame data 50G including the pixel signal of the G component. Note that by this demosaic processing, the resolution of the frame data 50G is also reduced to the resolution in each of the color filter units 152.

Figure 20:
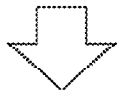
FIG. 20 is a diagram for explaining the overview of the convolution operation according to the modification of the embodiment (part 3).

Then, as illustrated in FIG. 20, the signal processing circuit 108 extracts the pixel signal read from the unit pixel 110 including the color filter 150 that selectively transmits the wavelength of the B component from the frame data 50 read from the pixel array unit 101, thereby generating the frame data 50B including the pixel signal of the B component. Note that by this demosaic processing, the resolution of the frame data 50B is also reduced to the resolution in each of the color filter units 152.

Figure 21:
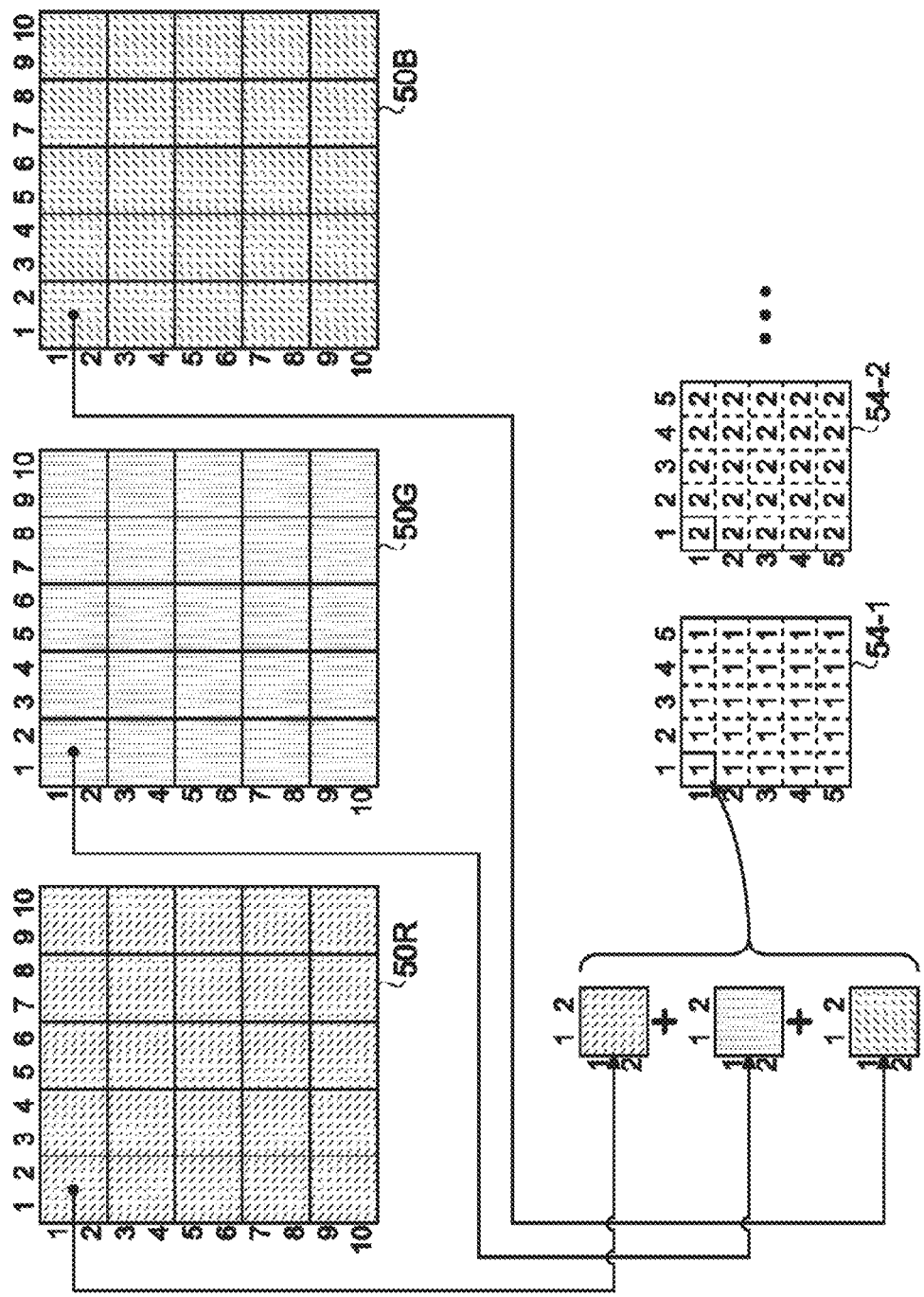
FIG. 21 is a diagram for explaining the overview of the convolution operation according to the modification of the embodiment (part 4).

In this way, when the frame data 50R, 50G, and 50B for each color component of the RGB three primary colors are generated, the signal processing circuit 108 then generates the feature maps 54-1 to 54-25 (binary data) for each type of the convolution filter 130 as the result of the optical convolution operation by performing summation of the pixel signals read from the unit pixels 110 included in the same color filter unit 152 among the respective frame data 50R, 50G, and 50B for each type of the convolution filter 130, as illustrated in FIG. 21.

1.15 Operation and Effect

As described above, according to the present embodiment, the convolution operation can be performed using the convolution filter array 122 which is a physical configuration. Thus, for example, since the convolution layer of the first layer in the CNN can be omitted and the processing can be performed from the pooling layer of the second layer, higher speed image recognition processing can be performed.

Furthermore, in the present embodiment, for example, the convolution operation can be performed for a plurality of channels corresponding to the color components of the RGB three primary colors. In this way, by using the plurality of channels as input, it is possible to perform the image recognition processing with higher accuracy.

2. Application to Mobile Body

The technology according to the present disclosure (present technology) can be applied to various products. For example, the technology according to the present disclosure may be implemented as a device mounted on any type of mobile body such as an automobile, an electric vehicle, a hybrid electric vehicle, a motorcycle, a bicycle, a personal mobility, an airplane, a drone, a ship, and a robot.

Figure 22:
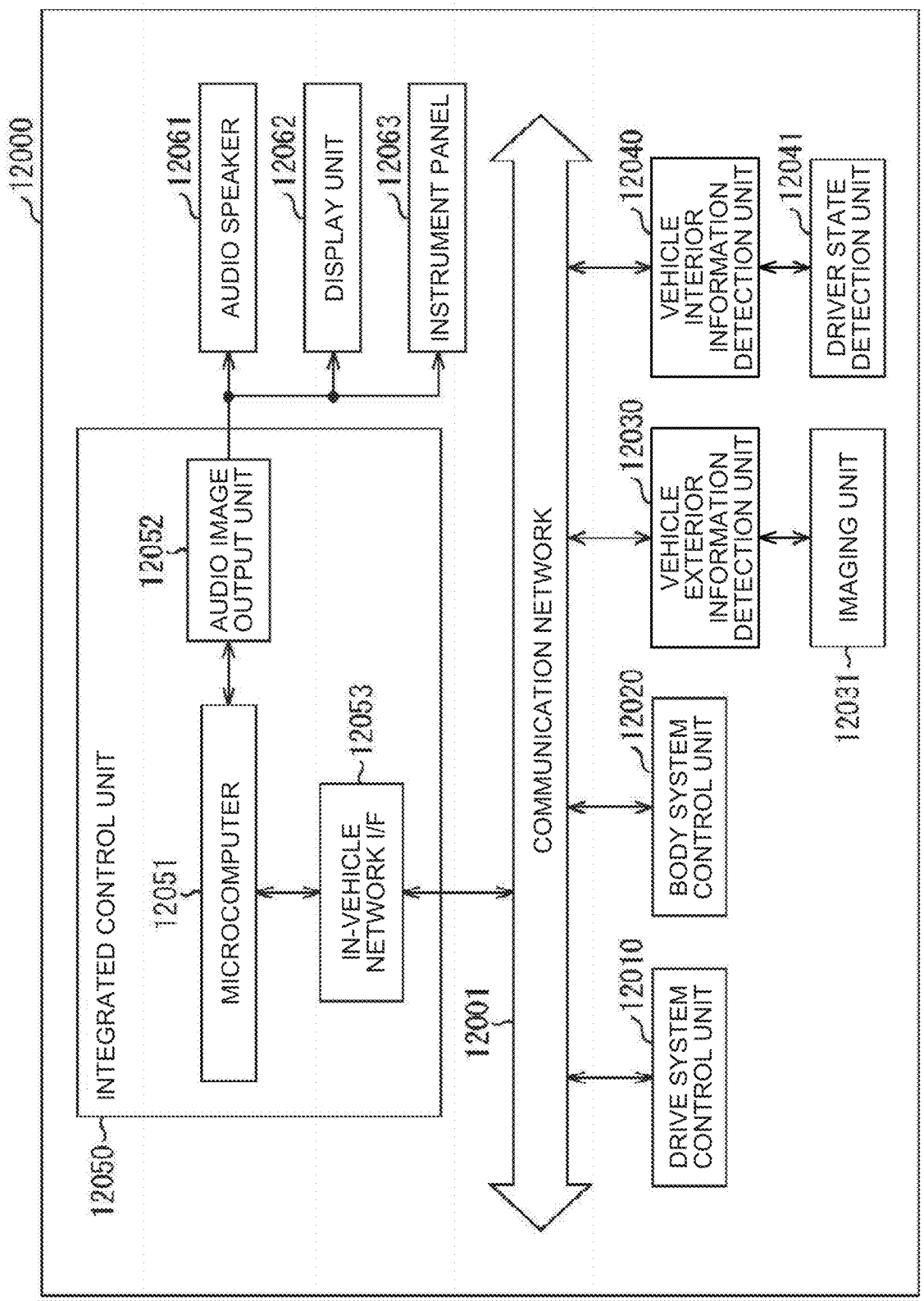
FIG. 22 is a block diagram illustrating an example of a schematic configuration of a vehicle control system.

FIG. 22 is a block diagram illustrating a schematic configuration example of a vehicle control system which is an example of a mobile body control system to which the technology according to the present disclosure can be applied.

A vehicle control system 12000 includes a plurality of electronic control units connected via a communication network 12001. In the example illustrated in FIG. 22, the vehicle control system 12000 includes a drive system control unit 12010, a body system control unit 12020, a vehicle exterior information detection unit 12030, a vehicle interior information detection unit 12040, and an integrated control unit 12050. Furthermore, as a functional configuration of the integrated control unit 12050, a microcomputer 12051, an audio image output unit 12052, and an in-vehicle network interface (I/F) 12053 are illustrated.

The drive system control unit 12010 controls operation of devices related to a drive system of the vehicle according to various programs. For example, the drive system control unit 12010 functions as a control device of a driving force generation device for generating a driving force of the vehicle such as an internal combustion engine or a driving motor, a driving force transmission mechanism for transmitting the driving force to wheels, a steering mechanism for adjusting a steering angle of the vehicle, a braking device for generating a braking force of the vehicle, and the like.

The body system control unit 12020 controls operation of various devices mounted on the vehicle body according to various programs. For example, the body system control unit 12020 functions as a control device of a keyless entry system, a smart key system, a power window device, or various lamps such as a headlamp, a back lamp, a brake lamp, a blinker, or a fog lamp. In this case, radio waves transmitted from a portable device that substitutes for a key or signals of various switches can be input to the body system control unit 12020. The body system control unit 12020 receives input of these radio waves or signals, and controls a door lock device, the power window device, the lamps, and the like of the vehicle.

The vehicle exterior information detection unit 12030 detects information outside the vehicle on which the vehicle control system 12000 is mounted. For example, an imaging unit 12031 is connected to the vehicle exterior information detection unit 12030. The vehicle exterior information detection unit 12030 causes the imaging unit 12031 to capture an image outside the vehicle, and receives the captured image. The vehicle exterior information detection unit 12030 may perform object detection processing or distance detection processing of a person, a vehicle, an obstacle, a sign, a character on a road surface, or the like on the basis of the received image.

The imaging unit 12031 is an optical sensor that receives light and outputs an electric signal corresponding to an amount of the light received. The imaging unit 12031 can output the electric signal as the image and can also output the electric signal as distance measurement information. Furthermore, the light received by the imaging unit 12031 may be visible light or invisible light such as infrared rays.

The vehicle interior information detection unit 12040 detects information inside the vehicle. For example, a driver state detection unit 12041 that detects a state of a driver is connected to the vehicle interior information detection unit 12040. The driver state detection unit 12041 includes, for example, a camera that images the driver, and the vehicle interior information detection unit 12040 may calculate the degree of fatigue or the degree of concentration of the driver or may determine whether or not the driver is dozing off on the basis of detection information input from the driver state detection unit 12041.

The microcomputer 12051 can calculate a control target value of the driving force generation device, the steering mechanism, or the braking device on the basis of the information inside and outside the vehicle acquired by the vehicle exterior information detection unit 12030 or the vehicle interior information detection unit 12040, and output a control command to the drive system control unit 12010. For example, the microcomputer 12051 can perform cooperative control for the purpose of implementing functions of an advanced driver assistance system (ADAS) including collision avoidance or impact mitigation of the vehicle, follow-up traveling based on an inter-vehicle distance, vehicle speed maintenance traveling, vehicle collision warning, vehicle lane departure warning, or the like.

Furthermore, the microcomputer 12051 can perform cooperative control for the purpose of automatic driving or the like in which the vehicle autonomously travels without depending on the operation of the driver, by controlling the driving force generation device, the steering mechanism, the braking device, or the like on the basis of information around the vehicle acquired by the vehicle exterior information detection unit 12030 or the vehicle interior information detection unit 12040.

Furthermore, the microcomputer 12051 can output the control command to the body system control unit 12020 on the basis of information outside the vehicle acquired by the vehicle exterior information detection unit 12030. For example, the microcomputer 12051 can perform cooperative control for the purpose of preventing glare, such as switching from a high beam to a low beam, by controlling the headlamp according to a position of a preceding vehicle or an oncoming vehicle detected by the vehicle exterior information detection unit 12030.

The audio image output unit 12052 transmits an output signal of at least one of a sound or an image to an output device capable of visually or audibly notifying an occupant of the vehicle or the outside of the vehicle of information. In the example of FIG. 22, an audio speaker 12061, a display unit 12062, and an instrument panel 12063 are exemplified as the output device. The display unit 12062 may include, for example, at least one of an on-board display and a head-up display.

Figure 23:
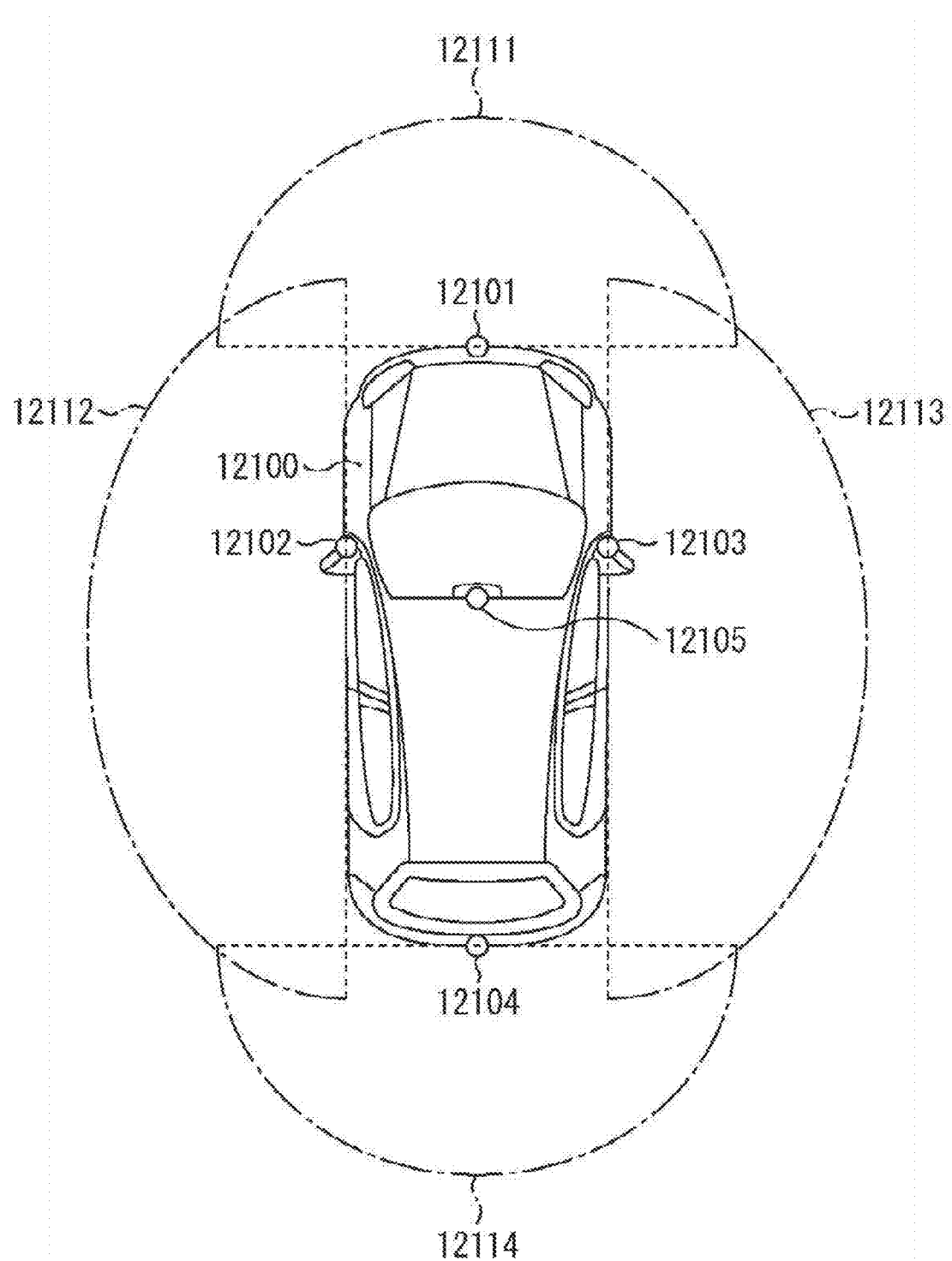
FIG. 23 is an explanatory diagram illustrating an example of installation positions of a vehicle exterior information detection unit and an imaging unit.

FIG. 23 is a diagram illustrating an example of an installation position of the imaging unit 12031.

In FIG. 23, imaging units 12101, 12102, 12103, 12104, and 12105 are included as the imaging unit 12031.

The imaging units 12101, 12102, 12103, 12104, and 12105 are provided, for example, at positions such as a front nose, a side mirror, a rear bumper, a back door, and an upper portion of a windshield in a vehicle interior of a vehicle 12100. The imaging unit 12101 provided at the front nose and the imaging unit 12105 provided at the upper portion of the windshield in the vehicle interior mainly acquire images in front of the vehicle 12100. The imaging units 12102 and 12103 provided at side mirrors mainly acquire images of sides of the vehicle 12100. The imaging unit 12104 provided on the rear bumper or the back door mainly acquires an image behind the vehicle 12100. The imaging unit 12105 provided at the upper portion of the windshield in the vehicle interior is mainly used to detect a preceding vehicle, a pedestrian, an obstacle, a traffic light, a traffic sign, a lane, or the like.

Note that FIG. 23 illustrates an example of imaging ranges of the imaging units 12101 to 12104. An imaging range 12111 indicates an imaging range of the imaging unit 12101 provided at the front nose, imaging ranges 12112 and 12113 indicate imaging ranges of the imaging units 12102 and 12103 respectively provided at the side mirrors, and an imaging range 12114 indicates an imaging range of the imaging unit 12104 provided at the rear bumper or the back door. For example, by superimposing image data captured by the imaging units 12101 to 12104, an overhead view image of the vehicle 12100 viewed from above is obtained.

At least one of the imaging units 12101 to 12104 may have a function of acquiring distance information. For example, at least one of the imaging units 12101 to 12104 may be a stereo camera including a plurality of imaging elements, or may be an imaging element having pixels for phase difference detection.

For example, the microcomputer 12051 can extract, as the preceding vehicle, a three-dimensional object traveling at a predetermined speed (for example, 0 km/h or more) in substantially the same direction as the vehicle 12100, in particular, the closest three-dimensional object on a traveling path of the vehicle 12100, by determining a distance to each three-dimensional object in the imaging ranges 12111 to 12114 and a temporal change of the distance (relative speed with respect to the vehicle 12100) on the basis of the distance information obtained from the imaging units 12101 to 12104. Furthermore, the microcomputer 12051 can set an inter-vehicle distance to be secured in advance in front of the preceding vehicle, and can perform automatic brake control (including follow-up stop control), automatic acceleration control (including follow-up start control), and the like. As described above, it is possible to perform cooperative control for the purpose of automatic driving or the like in which the vehicle autonomously travels without depending on the operation of the driver.

For example, on the basis of the distance information obtained from the imaging units 12101 to 12104, the microcomputer 12051 can classify three-dimensional object data regarding three-dimensional objects into two-wheeled vehicles, ordinary vehicles, large vehicles, pedestrians, and other three-dimensional objects such as utility poles, extract the three-dimensional object data, and use the three-dimensional object data for automatic avoidance of obstacles. For example, the microcomputer 12051 identifies the obstacles around the vehicle 12100 as the obstacles that can be visually recognized by the driver of the vehicle 12100 and the obstacles that are difficult to be visually recognized. Then, the microcomputer 12051 determines a collision risk indicating a risk of collision with each obstacle, and when the risk of collision is a set value or more and there is a possibility of collision, the microcomputer can perform driving assistance for collision avoidance by outputting an alarm to the driver via the audio speaker 12061 or the display unit 12062 or performing forced deceleration or avoidance steering via the drive system control unit 12010.

At least one of the imaging units 12101 to 12104 may be an infrared camera that detects infrared rays. For example, the microcomputer 12051 can recognize the pedestrian by determining whether or not the pedestrian is present in the captured images of the imaging units 12101 to 12104. Such pedestrian recognition is performed by, for example, a procedure of extracting feature points in the captured images of the imaging units 12101 to 12104 as infrared cameras and a procedure of performing pattern matching processing on a series of feature points indicating an outline of an object to determine whether or not the object is the pedestrian. When the microcomputer 12051 determines that the pedestrian is present in the captured images of the imaging units 12101 to 12104 and recognizes the pedestrian, the audio image output unit 12052 controls the display unit 12062 to superimpose and display a square contour line for emphasis on the recognized pedestrian. Furthermore, the audio image output unit 12052 may control the display unit 12062 to display an icon or the like indicating the pedestrian at a desired position.

Although the embodiments of the present disclosure have been described above, a technical scope of the present disclosure is not limited to the above-described embodiments as they are, and various modifications can be made without departing from the gist of the present disclosure. In addition, components of different embodiments and modifications may be appropriately combined.

Furthermore, effects of each embodiment described in the present specification are merely examples and are not limited, and other effects may be provided.

Furthermore, each of the above-described embodiments may be used alone, or may be used in combination with another embodiment.

Note that the present technology can also have the following configurations.

(1)
A light receiving device comprising:
a plurality of first filters that each transmit an edge component in a predetermined direction in an incident image;
a plurality of second filters that each transmit light of a predetermined wavelength band in incident light; and
a plurality of photoelectric conversion elements that each photoelectrically convert light transmitted through one of the plurality of first filters and one of the plurality of second filters.

(2)
The light receiving device according to (1), wherein each of the first filters includes a diffraction grating.

(3)
The light receiving device according to (1) or (2), wherein each of the first filters is a Talbot diffraction grating.

(4)
The light receiving device according to any one of (1) to (3), wherein the plurality of first filters are Gabor filters.

(5)
The light receiving device according to any one of (1) to (4), wherein
the first filter includes a third filter that transmits an edge component in a first direction and a fourth filter that transmits an edge component in a second direction different from the first direction,
the second filter includes at least two fifth filters that transmit light of a first wavelength band and at least two sixth filters that transmit light of a second wavelength band different from the first wavelength band,
one of the fifth filters and one of the sixth filters are associated with the third filter, and
another one of the fifth filters and another one of the sixth filters are associated with the fourth filter.

(6)
The light receiving device according to any one of (1) to (4), wherein
the first filter includes at least two third filters that transmit an edge component in a first direction and at least two fourth filters that transmit an edge component in a second direction different from the first direction,
the second filter includes a fifth filter that transmits light of a first wavelength band and a sixth filter that transmits light of a second wavelength band different from the first wavelength band,
one of the third filters and one of the fourth filters are associated with the fifth filter, and
another one of the third filters and another one of the fourth filters are associated with the sixth filter.

(7)
The light receiving device according to any one of (1) to (6), wherein each of the first filters is associated with the photoelectric conversion element on a one-to-one basis.

(8)
The light receiving device according to any one of (1) to (7), further comprising an on-chip lens that condenses a part of the incident light on any of the photoelectric conversion elements.

(9)
The light receiving device according to (8), wherein the first filter is located between the photoelectric conversion element and the on-chip lens.

(10)

The light receiving device according to (9), wherein the second filter is located between the photoelectric conversion element and the first filter or between the first filter and the on-chip lens.

(11)

A solid-state imaging apparatus comprising:
the light receiving device according to any one of (1) to (10); and
a pixel circuit that reads a pixel signal of a voltage value corresponding to an amount of charge accumulated in each of the photoelectric conversion elements.

(12)

Electronic equipment comprising:
the solid-state imaging apparatus according to (11); and
a data processing unit that performs predetermined processing on data output from the solid-state imaging apparatus.

(13)

The electronic equipment according to (12), wherein the data processing unit performs machine learning processing using a learned model on the data read from the solid-state imaging apparatus.

(14)

The electronic equipment according to (13), wherein the data processing unit performs processing from a pooling layer of a second layer in a convolution neural network.

(15)

An information processing system comprising:
the electronic equipment according to any one of (12) to (14); and
a data processing device connected to the electronic equipment via a predetermined network.

(16)

The information processing system according to (15), wherein the data processing device performs processing from a pooling layer of a second layer in a convolution neural network.

REFERENCE SIGNS LIST

1 ELECTRONIC EQUIPMENT
10 IMAGING APPARATUS
11 IMAGING UNIT
11a OPTICAL SYSTEM
12 CONTROL UNIT
13 SIGNAL PROCESSING UNIT
14 DSP
15 MEMORY
16 OUTPUT UNIT
20 APPLICATION PROCESSOR
30 CLOUD SERVER
40 NETWORK
50, 50R, 50G, 50B, 950, 1050 FRAME DATA
51 FILTER
54, 54-1 to 54-25, 954-1 to 954-25 FEATURE MAP
100, 100A SOLID-STATE IMAGING APPARATUS (IMAGE SENSOR)
101 PIXEL ARRAY UNIT
102 VERTICAL DRIVE CIRCUIT
103 COLUMN PROCESSING CIRCUIT
104 HORIZONTAL DRIVE CIRCUIT
105 SYSTEM CONTROL UNIT
108 SIGNAL PROCESSING CIRCUIT
109 DATA STORAGE UNIT
110, 110A, 110B UNIT PIXEL
111 TRANSFER TRANSISTOR
112 RESET TRANSISTOR
113 AMPLIFICATION TRANSISTOR
114 SELECTION TRANSISTOR
121 SEMICONDUCTOR CHIP
122 CONVOLUTION FILTER ARRAY
123 COLOR FILTER ARRAY
124 MICROLENS ARRAY
130, 130A, 130B, 130-0, 130-45, 130-90, 130-135 CONVOLUTION FILTER
131A, 131B, 132A, 132B DIFFRACTION GRATING
133 CONVOLUTION FILTER UNIT
150, 151R, 151G, 151B COLOR FILTER
152 COLOR FILTER UNIT
154 COMBINATION FILTER UNIT
155R, 155G, 155B COMBINATION FILTER UNIT
160 ON-CHIP LENS
LD PIXEL DRIVE LINE
LD111 TRANSFER TRANSISTOR DRIVE LINE
LD112 RESET TRANSISTOR DRIVE LINE
LD114 SELECTION TRANSISTOR DRIVE LINE
PD, PD-A, PD-B PHOTODIODE
VSL VERTICAL SIGNAL LINE

The invention claimed is:

1. A light receiving device comprising:
a plurality of first filters that each transmit an edge component in a predetermined direction in an incident image;
a plurality of second filters that each transmit light of a predetermined wavelength band in incident light; and
a plurality of photoelectric conversion elements that each photoelectrically convert light transmitted through one of the plurality of first filters and one of the plurality of second filters,
wherein each of the plurality of first filters includes a third filter that transmits an edge component in a first direction and a fourth filter that transmits an edge component in a second direction different from the first direction.

2. The light receiving device according to claim 1, wherein each of the plurality of first filters includes a diffraction grating.

3. The light receiving device according to claim 1, wherein each of the plurality of first filters is a Talbot diffraction grating.

4. The light receiving device according to claim 1, wherein the plurality of first filters are Gabor filters.

5. The light receiving device according to claim 1, wherein
each of the plurality of second filters includes at least two fifth filters that transmit light of a first wavelength band and at least two sixth filters that transmit light of a second wavelength band different from the first wavelength band,
one of the at least two fifth filters and one of the at least two sixth filters are associated with the third filter, and
another one of the at least two fifth filters and another one of the at least two sixth filters are associated with the fourth filter.

6. The light receiving device according to claim 1, wherein
each of the plurality of first filters includes at least two third filters that transmit an edge component in the first direction and at least two fourth filters that transmit an edge component in the second direction different from the first direction,
each of the plurality of second filters includes a fifth filter that transmits light of a first wavelength band and a sixth filter that transmits light of a second wavelength band different from the first wavelength band, one of the at least two third filters and one of the at least two fourth filters are associated with the fifth filter, and another one of the at least two third filters and another one of the at least two fourth filters are associated with the sixth filter.

7. The light receiving device according to claim 1, wherein each of the plurality of first filters are associated with the plurality of photoelectric conversion elements on a one-to-one basis.

8. The light receiving device according to claim 1, further comprising an on-chip lens that condenses a part of the incident light on any of the plurality of photoelectric conversion elements.

9. The light receiving device according to claim 8, wherein the plurality of first filters are located between the plurality of photoelectric conversion elements and the on-chip lens.

10. The light receiving device according to claim 9, wherein the plurality of second filters are located between the plurality of photoelectric conversion elements and the plurality of first filters or between the plurality of first filters and the on-chip lens.

11. A solid-state imaging apparatus comprising:
the light receiving device according to claim 1; and
a pixel circuit that reads a pixel signal of a voltage value corresponding to an amount of charge accumulated in each of the plurality of photoelectric conversion elements.

12. Electronic equipment comprising:
the solid-state imaging apparatus according to claim 11; and
a data processing unit that performs predetermined processing on data output from the solid-state imaging apparatus.

13. The electronic equipment according to claim 12, wherein the data processing unit performs machine learning processing using a learned model on the data read from the solid-state imaging apparatus.

14. The electronic equipment according to claim 13, wherein the data processing unit performs processing from a pooling layer of a second layer in a convolution neural network.

15. An information processing system comprising:
the electronic equipment according to claim 12; and
a data processing device connected to the electronic equipment via a predetermined network.

16. The information processing system according to claim 15, wherein the data processing device performs processing from a pooling layer of a second layer in a convolution neural network.

17. A light receiving device, comprising:
a plurality of first filters that each transmit an edge component in a predetermined direction in an incident image;
a plurality of second filters that each transmit light of a predetermined wavelength band in incident light; and
a plurality of photoelectric conversion elements that each photoelectrically convert light transmitted through one of the plurality of first filters and one of the plurality of second filters,
wherein each of the plurality of first filters includes a third filter that transmits an edge component in a first direction and a fourth filter that transmits an edge component in a second direction different from the first direction,
wherein each of the plurality of the second filters includes at least two fifth filters that transmit light of a first wavelength band and at least two sixth filters that transmit light of a second wavelength band different from the first wavelength band, and
wherein one of the fifth filters and one of the sixth filters are associated with the third filter, and
wherein another one of the fifth filters and another one of the sixth filters are associated with the fourth filter.

18. A light receiving device, comprising:
a plurality of first filters that each transmit an edge component in a predetermined direction in an incident image;
a plurality of second filters that each transmit light of a predetermined wavelength band in incident light; and
a plurality of photoelectric conversion elements that each photoelectrically convert light transmitted through one of the plurality of first filters and one of the plurality of second filters, wherein:
each of the plurality of first filters includes at least two third filters that transmit an edge component in a first direction and at least two fourth filters that transmit an edge component in a second direction different from the first direction,
each of the plurality of second filters includes a fifth filter that transmits light of a first wavelength band and a sixth filter that transmits light of a second wavelength band different from the first wavelength band,
one of the at least two third filters and one of the at least two fourth filters are associated with the fifth filter, and
another one of the at least two third filters and another one of the at least two fourth filters are associated with the sixth filter.

* * * * *